US006555946B1

(12) United States Patent
Finder et al.

(10) Patent No.: US 6,555,946 B1
(45) Date of Patent: Apr. 29, 2003

(54) ACOUSTIC WAVE DEVICE AND PROCESS FOR FORMING THE SAME

(75) Inventors: Jeffrey M. Finder, Chandler, AZ (US); Kurt Eisenbeiser, Tempe, AZ (US); Jamal Ramdani, Gilbert, AZ (US); Ravindranath Droopad, Chandler, AZ (US); William Jay Ooms, Chandler, AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/624,803

(22) Filed: Jul. 24, 2000

(51) Int. Cl.[7] ............................................... H01L 41/08

(52) U.S. Cl. ........................ 310/324; 311/322; 311/334

(58) Field of Search ................................ 310/311, 322, 310/324, 334, 358, 313 R

(56) References Cited

U.S. PATENT DOCUMENTS

| 3,670,213 A | 6/1972 | Nakawaga et al. |
|---|---|---|
| 3,766,370 A | 10/1973 | Walther |
| 3,802,967 A | 4/1974 | Ladany et al. |
| 3,935,031 A | 1/1976 | Adler |
| 4,006,989 A | 2/1977 | Andringa |
| 4,084,130 A | 4/1978 | Holton |
| 4,174,422 A | 11/1979 | Matthews et al. |
| 4,242,595 A | 12/1980 | Lehovec |
| 4,284,329 A | 8/1981 | Smith et al. |
| 4,289,920 A | 9/1981 | Hovel |
| 4,392,297 A | 7/1983 | Little |
| 4,398,342 A | 8/1983 | Pitt et al. |
| 4,404,265 A | 9/1983 | Manasevit |
| 4,424,589 A | 1/1984 | Thomas et al. |
| 4,439,014 A | 3/1984 | Stacy et al. |
| 4,442,590 A | 4/1984 | Stockton et al. |
| 4,452,720 A | 6/1984 | Harada et al. |
| 4,459,325 A | 7/1984 | Nozawa et al. |
| 4,482,422 A | 11/1984 | McGinn et al. |
| 4,482,906 A | 11/1984 | Hovel et al. |
| 4,484,332 A | 11/1984 | Hawrylo |

(List continued on next page.)

FOREIGN PATENT DOCUMENTS

| DE | 196 07 107 | 8/1997 |
|---|---|---|
| DE | 197 12 496 | 10/1997 |
| DE | 100 17 137 | 10/2000 |

(List continued on next page.)

OTHER PUBLICATIONS

Wen–Ching Shih et al; "Theoretical Investigation of The SAW Properties of Ferroelectric Film Composite Structures"; IEE Transactions of Ultrasonics, Ferroelectrics, and Frequency Control, vol. 45, No. 2, Mar. 1998; pp. 305–316.

Zhu Dazhong et al; "Design of $ZnO/SiO_2/Si$ Monolithic Integrated Programmable SAW Filter"; Proceedings of Fifth International Conference on Solid–State and integrated Circuit Technology; Oct. 21–23, 1998; pp. 826–829.

"Optimizing GMR Spin Valves: The Outlook for Improved Properties", W. F. Englhoff et al., 1998 Int'l Non Volatile Memory Technology Conference, pp. 34–37.

(List continued on next page.)

Primary Examiner—Mark O. Budd
(74) Attorney, Agent, or Firm—Oblon, Spivak, McClelland, Maier & Neustadt, P.C.

(57) ABSTRACT

High quality epitaxial layers of piezoelectric material materials can be grown overlying large silicon wafers by first growing an accommodating buffer layer on a silicon wafer. The accommodating buffer layer is a layer of monocrystalline oxide spaced apart from the silicon wafer by an amorphous interface layer of silicon oxide. The amorphous interface layer dissipates strain and permits the growth of a high quality monocrystalline oxide accommodating buffer layer. Any lattice mismatch between the accommodating buffer layer and the underlying silicon substrate is taken care of by the amorphous interface layer.

26 Claims, 4 Drawing Sheets

U.S. PATENT DOCUMENTS

| | | |
|---|---|---|
| 4,523,211 A | 6/1985 | Morimoto et al. |
| 4,629,821 A | 12/1986 | Bronstein-Bonte et al. |
| 4,661,176 A | 4/1987 | Manasevit |
| 4,667,088 A | 5/1987 | Kramer |
| 4,681,982 A | 7/1987 | Yoshida |
| 4,748,485 A | 5/1988 | Vasudev |
| 4,756,007 A | 7/1988 | Qureshi et al. |
| 4,772,929 A | 9/1988 | Manchester et al. |
| 4,773,063 A | 9/1988 | Hunsperger et al. |
| 4,774,205 A | 9/1988 | Choi et al. |
| 4,777,613 A | 10/1988 | Shahan et al. |
| 4,793,872 A | 12/1988 | Meunier et al. |
| 4,802,182 A | 1/1989 | Thornton et al. |
| 4,815,084 A | 3/1989 | Scifres et al. |
| 4,841,775 A * | 6/1989 | Ikeda et al. ............. 310/324 X |
| 4,845,044 A | 7/1989 | Ariyoshi et al. |
| 4,846,926 A | 7/1989 | Kay et al. |
| 4,855,249 A | 8/1989 | Akasaki et al. |
| 4,868,376 A | 9/1989 | Lessin et al. |
| 4,876,208 A | 10/1989 | Gustafson et al. |
| 4,876,219 A | 10/1989 | Eshita et al. |
| 4,882,300 A | 11/1989 | Inoue et al. ................. 437/236 |
| 4,885,376 A | 12/1989 | Verkade |
| 4,888,202 A | 12/1989 | Murakami et al. |
| 4,889,402 A | 12/1989 | Reinhart |
| 4,891,091 A | 1/1990 | Shastry |
| 4,896,194 A | 1/1990 | Suzuki |
| 4,901,133 A | 2/1990 | Curran et al. |
| 4,912,087 A | 3/1990 | Aslam et al. |
| 4,928,154 A | 5/1990 | Umeno et al. |
| 4,963,508 A | 10/1990 | Umeno et al. |
| 4,963,949 A | 10/1990 | Wanlass et al. |
| 4,965,649 A | 10/1990 | Zanio et al. |
| 4,984,043 A | 1/1991 | Vinal |
| 4,999,842 A | 3/1991 | Huang et al. ................. 372/45 |
| 5,028,976 A | 7/1991 | Ozaki et al. |
| 5,051,790 A | 9/1991 | Hammer |
| 5,053,835 A | 10/1991 | Horikawa et al. |
| 5,055,445 A * | 10/1991 | Belt et al. ....................... 505/1 |
| 5,060,031 A | 10/1991 | Abrokwah et al. |
| 5,063,081 A | 11/1991 | Cozzette et al. |
| 5,063,166 A | 11/1991 | Mooney et al. |
| 5,067,809 A | 11/1991 | Tsubota |
| 5,073,981 A | 12/1991 | Giles et al. |
| 5,081,062 A | 1/1992 | Vasudev et al. |
| 5,081,519 A | 1/1992 | Nishimura et al. |
| 5,116,461 A | 5/1992 | Lebby et al. |
| 5,127,067 A | 6/1992 | Delcoco et al. |
| 5,132,648 A | 7/1992 | Trinh et al. |
| 5,140,651 A | 8/1992 | Soref et al. |
| 5,141,894 A | 8/1992 | Bisaro et al. |
| 5,143,854 A | 9/1992 | Pirrung et al. |
| 5,144,409 A | 9/1992 | Ma |
| 5,155,658 A | 10/1992 | Inam et al. ................. 361/321 |
| 5,159,413 A | 10/1992 | Calviello et al. |
| 5,173,474 A | 12/1992 | Connell et al. |
| 5,185,589 A * | 2/1993 | Krishnaswamy et al. ....................... 310/324 X |
| 5,191,625 A | 3/1993 | Gustavsson |
| 5,194,397 A | 3/1993 | Cook et al. |
| 5,198,269 A | 3/1993 | Swartz et al. |
| 5,208,182 A | 5/1993 | Narayan et al. |
| 5,216,729 A | 6/1993 | Berger et al. |
| 5,221,367 A | 6/1993 | Chisholm et al. |
| 5,225,031 A | 7/1993 | McKee et al. |
| 5,227,196 A | 7/1993 | Itoh |
| 5,248,564 A | 9/1993 | Ramesh |
| 5,260,394 A | 11/1993 | Tazaki et al. |
| 5,266,355 A | 11/1993 | Wernberg et al. |
| 5,270,298 A | 12/1993 | Ramesh ......................... 505/1 |
| 5,280,013 A | 1/1994 | Newman et al. |
| 5,281,834 A | 1/1994 | Cambou et al. |
| 5,286,985 A | 2/1994 | Taddiken |
| 5,293,050 A | 3/1994 | Chapple-Sokol et al. |
| 5,306,649 A | 4/1994 | Hebert |
| 5,310,707 A | 5/1994 | Oishi et al. .................. 501/126 |
| 5,312,765 A | 5/1994 | Kanber |
| 5,314,547 A | 5/1994 | Heremans et al. |
| 5,326,721 A | 7/1994 | Summerfelt ................. 437/131 |
| 5,352,926 A | 10/1994 | Andrews |
| 5,356,509 A | 10/1994 | Terranova et al. |
| 5,356,831 A | 10/1994 | Calviello et al. |
| 5,357,122 A | 10/1994 | Okubora et al. |
| 5,358,925 A | 10/1994 | Connell et al. |
| 5,371,734 A | 12/1994 | Fischer |
| 5,372,992 A | 12/1994 | Itozaki et al. |
| 5,391,515 A | 2/1995 | Kao et al. |
| 5,393,352 A | 2/1995 | Summerfelt |
| 5,394,489 A | 2/1995 | Koch |
| 5,404,581 A | 4/1995 | Honjo |
| 5,405,802 A | 4/1995 | Yamagata et al. |
| 5,406,202 A | 4/1995 | Mehrgardt et al. |
| 5,418,216 A | 5/1995 | Fork |
| 5,418,389 A | 5/1995 | Watanabe .................... 257/295 |
| 5,436,759 A | 7/1995 | Dijaii et al. |
| 5,441,577 A | 8/1995 | Sasaki et al. |
| 5,442,191 A | 8/1995 | Ma |
| 5,442,561 A | 8/1995 | Yoshizawa et al. |
| 5,444,016 A | 8/1995 | Abrokwah et al. |
| 5,450,812 A | 9/1995 | McKee et al. |
| 5,453,727 A | 9/1995 | Shibasaki et al. |
| 5,466,631 A | 11/1995 | Ichikawa et al. |
| 5,473,047 A | 12/1995 | Shi |
| 5,473,171 A | 12/1995 | Summerfelt |
| 5,478,653 A | 12/1995 | Guenzer |
| 5,479,033 A | 12/1995 | Baca et al. |
| 5,479,317 A | 12/1995 | Ramesh |
| 5,480,829 A | 1/1996 | Abrokwah et al. |
| 5,481,102 A | 1/1996 | Hazelrigg, Jr. |
| 5,482,003 A | 1/1996 | McKee et al. |
| 5,486,406 A | 1/1996 | Shi |
| 5,491,461 A | 2/1996 | Partin et al. |
| 5,492,859 A | 2/1996 | Sakaguchi et al. |
| 5,494,711 A | 2/1996 | Takeda et al. |
| 5,504,035 A | 4/1996 | Rostoker et al. |
| 5,504,183 A | 4/1996 | Shi |
| 5,511,238 A | 4/1996 | Bayraktaroglu |
| 5,512,773 A | 4/1996 | Wolf et al. |
| 5,514,484 A | 5/1996 | Nashimoto |
| 5,514,904 A | 5/1996 | Onga et al. |
| 5,515,047 A | 5/1996 | Yamakido et al. |
| 5,515,810 A | 5/1996 | Yamashita et al. |
| 5,519,235 A | 5/1996 | Ramesh |
| 5,528,057 A | 6/1996 | Yanagase et al. |
| 5,528,067 A | 6/1996 | Farb et al. |
| 5,528,414 A | 6/1996 | Oakley |
| 5,530,235 A | 6/1996 | Stefik et al. |
| 5,538,941 A | 7/1996 | Findikoglu et al. |
| 5,541,422 A | 7/1996 | Wolf et al. |
| 5,549,977 A | 8/1996 | Jin et al. |
| 5,551,238 A | 9/1996 | Prueitt |
| 5,552,547 A | 9/1996 | Shi |
| 5,553,089 A | 9/1996 | Seki et al. |
| 5,556,463 A | 9/1996 | Guenzer |
| 5,569,953 A | 10/1996 | Kikkawa et al. |
| 5,572,052 A | 11/1996 | Kashihara et al. |
| 5,576,879 A | 11/1996 | Nashimoto |
| 5,588,995 A | 12/1996 | Sheldon |
| 5,589,284 A | 12/1996 | Summerfelt |
| 5,596,205 A | 1/1997 | Reedy et al. |
| 5,596,214 A | 1/1997 | Endo |

| Patent No. | Date | Inventor(s) | Ref. |
|---|---|---|---|
| 5,602,418 A | 2/1997 | Imai et al. | |
| 5,603,764 A | 2/1997 | Matsuda et al. | |
| 5,606,184 A | 2/1997 | Abrokwah et al. | |
| 5,608,046 A | 3/1997 | Cook et al. | |
| 5,610,744 A | 3/1997 | Ho et al. | |
| 5,614,739 A | 3/1997 | Abrokwah et al. | |
| 5,623,552 A | 4/1997 | Lane | |
| 5,633,724 A | 5/1997 | King et al. | |
| 5,640,267 A | 6/1997 | May et al. | |
| 5,650,646 A | 7/1997 | Summerfelt | |
| 5,656,382 A | 8/1997 | Nashimoto | |
| 5,659,180 A | 8/1997 | Shen et al. | |
| 5,661,112 A | 8/1997 | Hatta et al. | |
| 5,670,798 A | 9/1997 | Schetzina | |
| 5,670,800 A | 9/1997 | Nakao et al. | |
| 5,674,366 A | 10/1997 | Hayashi et al. | 204/298.09 |
| 5,679,965 A | 10/1997 | Schetzina | |
| 5,689,123 A | 11/1997 | Major et al. | |
| 5,725,641 A | 3/1998 | MacLeod | |
| 5,729,394 A | 3/1998 | Sevier et al. | |
| 5,729,641 A | 3/1998 | Chandonnet et al. | |
| 5,731,220 A | 3/1998 | Tsu et al. | 437/60 |
| 5,733,641 A | 3/1998 | Fork et al. | |
| 5,734,672 A | 3/1998 | McMinn et al. | |
| 5,735,949 A | 4/1998 | Mantl et al. | |
| 5,741,724 A | 4/1998 | Ramdani et al. | |
| 5,745,631 A | 4/1998 | Reinker | |
| 5,753,300 A | 5/1998 | Wessels et al. | |
| 5,754,319 A | 5/1998 | Van De Voorde et al. | |
| 5,760,426 A | 6/1998 | Marx et al. | |
| 5,764,676 A | 6/1998 | Paoli et al. | |
| 5,767,543 A | 6/1998 | Ooms et al. | |
| 5,770,887 A | 6/1998 | Tadatomo et al. | |
| 5,776,359 A | 7/1998 | Schultz et al. | |
| 5,776,621 A | 7/1998 | Nashimoto | |
| 5,777,350 A | 7/1998 | Nakamura et al. | |
| 5,777,762 A | 7/1998 | Yamamoto | |
| 5,778,018 A | 7/1998 | Yoshikawa et al. | |
| 5,778,116 A | 7/1998 | Tomich | |
| 5,789,733 A | 8/1998 | Jachimowicz et al. | |
| 5,789,845 A * | 8/1998 | Wakada et al. | 310/324 |
| 5,790,583 A | 8/1998 | Ho | |
| 5,792,569 A | 8/1998 | Sun et al. | |
| 5,792,679 A | 8/1998 | Nakato | |
| 5,796,648 A | 8/1998 | Kawakubo et al. | |
| 5,801,072 A | 9/1998 | Barber | |
| 5,801,105 A | 9/1998 | Yano et al. | 438/785 |
| 5,807,440 A | 9/1998 | Kubota et al. | |
| 5,810,923 A | 9/1998 | Yano et al. | |
| 5,812,272 A | 9/1998 | King et al. | |
| 5,814,583 A | 9/1998 | Itozaki et al. | |
| 5,825,055 A | 10/1998 | Summerfelt | |
| 5,825,799 A | 10/1998 | Ho et al. | |
| 5,827,755 A | 10/1998 | Yonchara et al. | |
| 5,828,080 A | 10/1998 | Yano et al. | 257/43 |
| 5,830,270 A | 11/1998 | McKee et al. | |
| 5,833,603 A | 11/1998 | Kovacs et al. | |
| 5,834,362 A | 11/1998 | Miyagaki et al. | |
| 5,838,035 A | 11/1998 | Ramesh | |
| 5,844,260 A | 12/1998 | Ohori | |
| 5,846,846 A | 12/1998 | Suh et al. | |
| 5,857,049 A | 1/1999 | Beranek et al. | |
| 5,858,814 A | 1/1999 | Goossen et al. | |
| 5,861,966 A | 1/1999 | Ortel | |
| 5,863,326 A | 1/1999 | Nause et al. | |
| 5,869,845 A | 2/1999 | Vander Wagt et al. | |
| 5,872,493 A * | 2/1999 | Ella | 310/322 X |
| 5,873,977 A | 2/1999 | Desu et al. | |
| 5,874,860 A | 2/1999 | Brunel et al. | 330/285 |
| 5,879,956 A | 3/1999 | Seon et al. | |
| 5,880,452 A | 3/1999 | Plesko | |
| 5,883,564 A | 3/1999 | Partin | |
| 5,883,996 A | 3/1999 | Knapp et al. | |
| 5,886,867 A | 3/1999 | Chivukula et al. | |
| 5,888,296 A | 3/1999 | Ooms et al. | |
| 5,907,792 A | 5/1999 | Droopad et al. | |
| 5,912,068 A | 6/1999 | Jia | |
| 5,926,496 A | 7/1999 | Ho et al. | |
| 5,937,274 A | 8/1999 | Kondow et al. | |
| 5,937,285 A | 8/1999 | Abrokwah et al. | |
| 5,948,161 A | 9/1999 | Kizuki | |
| 5,955,591 A | 9/1999 | Imbach et al. | |
| 5,959,879 A | 9/1999 | Koo | |
| 5,962,069 A | 10/1999 | Schindler et al. | |
| 5,963,291 A | 10/1999 | Wu et al. | |
| 5,966,323 A | 10/1999 | Chen et al. | |
| 5,981,400 A | 11/1999 | Lo | |
| 5,984,190 A | 11/1999 | Nevill | |
| 5,987,011 A | 11/1999 | Toh | |
| 5,990,495 A | 11/1999 | Ohba | |
| 5,995,359 A | 11/1999 | Klee et al. | |
| 6,002,375 A | 12/1999 | Corman et al. | 343/853 |
| 6,008,762 A | 12/1999 | Nghiem | |
| 6,011,641 A | 1/2000 | Shin et al. | |
| 6,011,646 A | 1/2000 | Mirkarimi et al. | |
| 6,020,222 A | 2/2000 | Wollesen | |
| 6,022,140 A | 2/2000 | Fraden et al. | |
| 6,022,410 A | 2/2000 | Yu et al. | |
| 6,022,963 A | 2/2000 | McGall et al. | |
| 6,023,082 A | 2/2000 | McKee et al. | |
| 6,028,853 A | 2/2000 | Haartsen | |
| 6,045,626 A | 4/2000 | Yano et al. | |
| 6,046,464 A | 4/2000 | Schetzina | |
| 6,049,702 A | 4/2000 | Tham et al. | |
| 6,055,179 A | 4/2000 | Koganei et al. | 365/158 |
| 6,058,131 A | 5/2000 | Pan | |
| 6,064,078 A | 5/2000 | Northrup et al. | |
| 6,064,092 A | 5/2000 | Park | |
| 6,078,717 A | 6/2000 | Nashimoto et al. | |
| 6,083,697 A | 7/2000 | Beecher et al. | |
| 6,087,681 A | 7/2000 | Shakuda | |
| 6,088,216 A | 7/2000 | Laibowitz et al. | |
| 6,090,659 A | 7/2000 | Laibowitz et al. | |
| 6,093,302 A | 7/2000 | Montgomery | |
| 6,096,584 A | 8/2000 | Ellis-Monaghan et al. | |
| 6,103,008 A | 8/2000 | McKee et al. | |
| 6,107,653 A | 8/2000 | Fitzgerald | |
| 6,107,721 A | 8/2000 | Lakin | |
| 6,108,125 A | 8/2000 | Yano | |
| 6,113,690 A | 9/2000 | Yu et al. | |
| 6,114,996 A | 9/2000 | Nghiem | |
| 6,121,642 A | 9/2000 | Newns | |
| 6,128,178 A | 10/2000 | Newns | |
| 6,134,114 A | 10/2000 | Ungermann et al. | |
| 6,136,666 A | 10/2000 | So | |
| 6,137,603 A | 10/2000 | Henmi | |
| 6,143,072 A | 11/2000 | McKee et al. | |
| 6,146,906 A | 11/2000 | Inoue et al. | |
| 6,150,239 A | 11/2000 | Goesele et al. | |
| 6,153,010 A | 11/2000 | Kiyoku et al. | |
| 6,153,454 A | 11/2000 | Krivokapic | |
| 6,173,474 B1 | 1/2001 | Conrad | |
| 6,174,755 B1 | 1/2001 | Manning | |
| 6,175,497 B1 | 1/2001 | Tseng et al. | |
| 6,175,555 B1 | 1/2001 | Hoole | |
| 6,180,252 B1 | 1/2001 | Farrell et al. | |
| 6,180,486 B1 | 1/2001 | Leobandung et al. | |
| 6,184,044 B1 | 2/2001 | Sone et al. | |
| 6,184,144 B1 | 2/2001 | Lo | |
| 6,191,011 B1 | 2/2001 | Gilboa et al. | |
| 6,197,503 B1 | 3/2001 | Vo-Dinh et al. | |
| 6,204,737 B1 * | 3/2001 | Ella | 310/327 X |

| | | |
|---|---|---|
| 6,208,453 B1 | 3/2001 | Wessels et al. |
| 6,210,988 B1 | 4/2001 | Howe et al. |
| 6,211,096 B1 | 4/2001 | Allman et al. |
| 6,222,654 B1 | 4/2001 | Frigo |
| 6,224,669 B1 | 5/2001 | Yi et al. |
| 6,225,051 B1 | 5/2001 | Sugiyama et al. |
| 6,229,159 B1 | 5/2001 | Suzuki |
| 6,235,145 B1 | 5/2001 | Li et al. |
| 6,238,946 B1 | 5/2001 | Ziegler |
| 6,239,449 B1 | 5/2001 | Fafard et al. |
| 6,241,821 B1 | 6/2001 | Yu et al. |
| 6,242,686 B1 | 6/2001 | Kishimoto et al. |
| 6,248,459 B1 | 6/2001 | Wang et al. |
| 6,248,621 B1 | 6/2001 | Wilk et al. |
| 6,252,261 B1 | 6/2001 | Usui et al. |
| 6,255,198 B1 | 7/2001 | Linthicum et al. |
| 6,265,749 B1 | 7/2001 | Gardner et al. |
| 6,268,269 B1 | 7/2001 | Lee et al. |
| 6,253,649 B1 | 8/2001 | Shinjo |
| 6,275,122 B1 | 8/2001 | Speidell et al. |
| 6,277,436 B1 | 8/2001 | Stauf et al. |
| 6,278,138 B1 | 8/2001 | Suzuki |
| 6,291,319 B1 | 9/2001 | Yu et al. |
| 6,313,486 B1 | 11/2001 | Kencke et al. |
| 6,316,785 B1 | 11/2001 | Nunoue et al. |
| 6,316,832 B1 | 11/2001 | Tsuzuki et al. |
| 6,326,645 B1 | 12/2001 | Kadota |
| 6,339,664 B1 | 1/2002 | Farjady et al. |
| 6,340,788 B1 | 1/2002 | King et al. |
| 6,343,171 B1 | 1/2002 | Yoshimura et al. |
| 6,348,373 B1 | 2/2002 | Ma et al. |
| 6,359,330 B1 | 3/2002 | Goudard |
| 6,362,017 B1 | 3/2002 | Manabe et al. |
| 6,367,699 B2 | 4/2002 | Ackley |
| 6,372,356 B1 | 4/2002 | Thornton et al. |
| 6,372,813 B1 | 4/2002 | Johnson et al. |
| 6,391,674 B2 | 5/2002 | Ziegler |
| 6,392,257 B1 | 5/2002 | Ramdani et al. |
| 6,427,066 B1 | 7/2002 | Grube |
| 2001/0013313 A1 | 8/2001 | Droopad et al. |
| 2002/0008234 A1 | 1/2002 | Emrick |
| 2002/0030246 A1 | 3/2002 | Eisenbeiser et al. |
| 2002/0047123 A1 | 4/2002 | Ramdani et al. |
| 2002/0072245 A1 | 6/2002 | Ooms et al. |

FOREIGN PATENT DOCUMENTS

| | | |
|---|---|---|
| EP | 0 250 171 | 12/1987 |
| EP | 0 331 467 | 9/1989 |
| EP | 0 342 937 | 11/1989 |
| EP | 0 455 526 | 6/1991 |
| EP | 0 514 018 | 11/1992 |
| EP | 0 581 239 | 2/1994 |
| EP | 0 602 568 | 6/1994 |
| EP | 0 607 435 | 7/1994 |
| EP | 0 682 266 | 11/1995 |
| EP | 0 810 666 | 12/1997 |
| EP | 0 875 922 | 11/1998 |
| EP | 0 926 739 | 6/1999 |
| EP | 0 957 522 | 11/1999 |
| EP | 0 964 259 | 12/1999 |
| EP | 0 964 453 | 12/1999 |
| EP | 0 999 600 | 5/2000 |
| EP | 1 001 468 | 5/2000 |
| EP | 1 043 426 | 10/2000 |
| EP | 1 109 212 | 6/2001 |
| GB | 1 319 311 | 6/1970 |
| GB | 2 335 792 | 9/1999 |
| JP | 52-88354 | 7/1977 |
| JP | 52 135684 | 11/1977 |
| JP | 54-134554 | 10/1979 |
| JP | 55-87424 | 7/1980 |
| JP | 58-213412 | 12/1983 |
| JP | 60-210018 | 10/1985 |
| JP | 60-212018 | 10/1985 |
| JP | 61-63015 | 4/1986 |
| JP | 61-108187 | 5/1986 |
| JP | 63-34994 | 2/1988 |
| JP | 63-131104 | 6/1988 |
| JP | 63-198365 | 8/1988 |
| JP | 64-50575 | 2/1989 |
| JP | 64-52329 | 2/1989 |
| JP | 1-102435 | 4/1989 |
| JP | 1-179411 | 7/1989 |
| JP | 2-391 | 1/1990 |
| JP | 2051220 | 2/1990 |
| JP | 3-41783 | 2/1991 |
| JP | 5-48072 | 2/1993 |
| JP | 5-152529 | 6/1993 |
| JP | 5-291299 | 11/1993 |
| JP | 6-232126 | 8/1994 |
| JP | 6-291299 | 10/1994 |
| JP | 6-334168 | 12/1994 |
| JP | 812494 | 1/1996 |
| JP | 9-67193 | 3/1997 |
| JP | 9-82913 | 3/1997 |
| JP | 10-256154 | 9/1998 |
| JP | 10-303396 | 11/1998 |
| JP | 10-321943 | 12/1998 |
| JP | 11135614 | 5/1999 |
| JP | 11-238683 | 8/1999 |
| JP | 11-260835 | 9/1999 |
| JP | 11340542 | 12/1999 |
| JP | 2000-068466 | 3/2000 |
| JP | 2 000 1645 | 6/2000 |
| WO | WO 92/10875 | 6/1992 |
| WO | WO 94/03908 | 2/1994 |
| WO | WO 97/45827 | 12/1997 |
| WO | WO 98/05807 | 1/1998 |
| WO | WO 99/14797 | 3/1999 |
| WO | WO 99/14804 | 3/1999 |
| WO | WO 99/19546 | 4/1999 |
| WO | WO 99/63580 | 12/1999 |
| WO | WO 00/16378 | 3/2000 |
| WO | WO 00/33363 | 6/2000 |
| WO | WO 00/48239 | 8/2000 |
| WO | WO 01/33585 | 5/2001 |
| WO | WO 01/37330 | 5/2001 |
| WO | WO 01/59814 A2 | 8/2001 |
| WO | WO 02 01648 | 1/2002 |
| WO | WO 02/09160 A2 | 1/2002 |
| WO | WO 02/33385 A2 | 4/2002 |

OTHER PUBLICATIONS

"Processing and Performance of Piezoelectric Films", Y. Wang et al., Univ. of MD, Wilcoxon Research Co., and Motorola Labs.

"Nonlinear acoustoelectric interactions in GaAs/LiNbO$_3$ structures", M. Rotter et al., 1999 American Institute of Physics, pp. 965–967.

"Surface acoustic wave propagation on lead zirconate titanate thin films", K. Sreenivas et al., App. Phys. Lett. 52(9), Feb. 19, 1988, pp. 709–711.

"Single Chip fused hybrids for acousto–electric and acousto–optic applications", M. Rotter et al., 1997 American Institute of Physics, pp. 2097–2099.

"Surface Acoustic Wave Propagation in PZT/YBCO/SrTiO$_3$ and PbTiO$_3$/YBCO/SrTiO$_3$ Epitaxial Heterostructures", Dept. of Physics & Astrophysics, Univ. of Delhi, pp. 275–283.

"Ferroelectric Field Effect Transisitor Based on Epitaxial Perovskite Heterostructures", S. Mathews et al., American Association for the Advancement of Science, 1997, pp. 238–240.

"Formation of Si Epi./MgO–$Al_2O_3$ Epi./$SiO_3$/Si and Its Epitaxial Film Quality," Masao Mikami et al., Fundamental Research Laboratories and Microelectronics Laboratores, pp. 31–34.

"An Epitaxial Si/Insulator/Si Structure Prepared by Vacuum Deposition of $CaF_2$ and Silicon," T. Asano et al., Graduate School of Science and Engineering, Tokyo Institute of Technology, pp. 143–151.

"Reaction and Regrowth Control of $CeO_2$ on Si(111) Surface for the Silicon–On–Insulator Structure," T. Chikyow et al., Appl. Phys. Lett 65(8), Aug. 22, 1994, pp. 1030–1032.

"Epitaxial Growth of $CeO_2$(100) Films on Si(100) Substrates by Dual Ion Beams Reactive Sputtering," J.F. Kang et al., Solid State Communications, vol. 108, No. 4, pp. 225–227.

"Vertical–Cavity Surface–Emitting Lasers Come of Age," Robert A. Morgan et al., SPIE, vol. 2683, pp. 18–29.

"Technical Analysis of Qualcomm QCP–800 Portable Cellular Phone(Transmitter Circuitry)," Talus Corporation, Qualcomm QCP–800 Technical Analysis Report, Dec. 10, 1996, pp. 5–8.

Nakagawara et al., Effects of Buffer Layers in Epitaxial Growth of $SrTiO_3$ Thin Film on Si(100), *J. Appl. Phys.*, 78 (12), Dec. 15, 1995, pp. 7226–7230.

Suzuki et al., "A Proposal of Epitaxial Oxide Thin Film Structures For Future Oxide Electronics," *Materials Science and Engineering B41*, (1996), pp. 166–173.

W. F. Egelhoff et al., "Optimizing GMR Spin Valves: The Outlook for Improved Properties", 1998 *Int'l Non Volatile Memory Technology Conference*, pp. 34–37.

Wang et al., "Processing and Performance of Piezoelectric Films", Univ. Of MD, Wilcoxon Research Col, and Motorola Labs, May 11, 2000.

M. Rotter et al., "Nonlinear Acoustoelectric Interactions in GaAs/$LiNbO_3$ Structures", *Applied Physics Letters*, vol. 75(7), Aug. 16, 1999, pp. 965–967.

K. Sreenivas et al., "Surface Acoustic Wave Propagation on Lead Zirconate Titanate Thin Films," *Appl. Phys. Lett.* 52 (9), Feb. 29, 1998, pp. 709–711.

M. Rotter et al., "Single Chip Fused Hybrids for Acousto–Electric and Acousto–Optic Applications," 1997 *Applied Physics Letters*, vol. 70(16), Apr. 21, 1997, pp. 2097–2099.

A. Mansingh et al., "Surface Acoustic Wave Propagation in PZT/YBCO/$SrTiO_3$ and $PbTiO_3$/YBCO/$SrTiO_3$ Epitaxial Heterostructures," *Ferroelectric*, vol. 224, pp. 275–282, 1999.

S. Mathews et al., "Ferroelectric Field Effect Transisitor Based on Epitaxial Perovskite Heterostructures", Science, vol. 276, Apr. 11, 1997, pp. 238–240.

R. Houdre et al., "Properties of GaAs on Si Grown by Molecular Beam Epitaxy," *Solid State and Materials Sciences*, vol. 16, Issue 2, 1990, pp. 91–114.

S. F. Fang et al., "Gallium Arsenide and Other Compound Semiconductors on Silicon," *J. Appl. Phys.*, 68(7), Oct. 1, 1990, pp. R31–R58.

Carlin et al., Impact of GaAs Buffer Thickness on Electronic Quality of GaAs Grown on Graded Ge/GeSi/Si Substrates, *Appl. Phys. Letter*, vol. 76, No. 14, Apr. 2000, pp. 1884–1886.

Ringel et al., "Epitaxial Integration of III–V Materials and Devices with Si Using Graded GeSi Buffers," $27^{th}$ International Symposium on Compound Semiconductors, Oct. 2000.

Zogg et al., "Progress in Compound–Semiconductor–on –Silicon–Heteroepitaxy with Fluoride Buffer Layers," *J. Electrochem Soc.*, vol. 136, No. 3, Mar. 1998, pp. 775–779.

Xiong et al., "Oxide Defined GaAs Vertical–Cavity Surface–Emitting Lasers on Si Substrates," *IEEE Photonics Technology Letters*, vol. 12, No. 2, Feb. 2000, pp. 110–112.

Clem et al., "Investigation of PZT/LSCO//Pt//Aerogel Thin Film Composites for Uncooled Pyroelectric IR Detectors," *Mat. Res. Soc. Symp. Proc.*, vol. 541, pp. 661–666, 1999.

Gunapala et al., "Bound–To–Quasi–Bound Quantum–Well Infrared Photodetectors," NASA Tech Brief, vol. 22, No. 9, Sep. 1998.

Abhay M. Joshi et al., "Monolithic InGaAs–on–silicon Wave Infrared Detector Arrays," *Intn. Society for Optical Engineering*, vol. 2999, pp. 211–224.

Bruley et al., "Nanostructure and Chemistry of a (100)MgO/(100) GaAs Interface," *Appl. Phys Lett*, 65(5), Aug. 1994, pp. 564–566.

Fork et al., "Epitaxial MgO On Si(001) for Y–Ba–Cu–O Thin Film Growth by Pulsed Laser Deposition," *Appl. Phys Lett.*, 58(20), May 20, 1991, pp. 2294–2296.

Himpsel et al., "Dialectrics on Semiconductors," *Materials Science and Engineering*, B1(1988), pp. 9–13.

Li et al., "Epitaxial $La_{0.67}Sr_{0.33}MnO_3$ Magnetic Tunnel Junctions," *J. Appl. Phys.* 81(8), Apr. 15, 1997, pp. 5509–5511.

O'Donnell et al., "Colossal Magnetoresistance Magnetic Tunnel Junctions Grown by Molecular–Beam Epitaxy," *Appl. Physics Letters*, vol. 76, No. 14, Apr. 3, 2000, pp. 1914–1916.

Mikami et al., "Formation of Si Epi/MgO–$Al_2O_3$Epi./$SiO_3$/Si and Its Epitaxial Film Quality," Fundamental Research Laboratories and Microelectronics Laboratories, pp. 31–34, 1983.

T. Asano et al., "An Epitaxial Si/Insulator/Si Structure Prepared by Vacuum Deposition of $CaF_2$ and Silicon," *Thin Solid Films*, vol. 93 (1982), pp. 143–150.

T. Chikyow et al., "Reaction and Regrowth Control of $CeO_2$ on Si(111) Surface for the Silicon–On–Insulator Structure," *Appl. Phys. Lett.*, vol. 65, No. 8, Aug. 22, 1994, pp. 1030–1032.

J.F. Kang, et al., "Epitaxial Growth of $CeO_2$(100) Films on Si(100) Substrates by Dual Ion Beams Reactive Sputtering," *Solid State Communications*, vol. 108, No. 4, pp. 225–227, 1998.

R.A. Morgan et al., "Vertical–Cavity Surface–Emitting Lasers Come of Age," *SPIE*, vol. 2683, pp. 18–29.

"Technical Analysis of Qualcomm QCP–800 Portable Cellular Phone (Transmitter Circuitry)," Talus Corporation, Qualcomm QCP–800 Technical Analysis Report, Dec. 10, 1996, pp. 5–8.

Jo–Ey Wong, et al.; "An Electrostatically–Actuated Mems Switch for Power Applications"; IEEE, 2000; pp. 633–638.

T. Mizuno, et al.; "Electron and Hole Mobility Enhancement in Strained–Si MOSFET's on SiGe–on–Insulator Substrates Fabricated by SIMOX Technology"; IEEE Electron Device Letters, vol. 21, No. 5, May 2000; pp. 230–232.

F. M. Buffer, et al.; "Strain–dependence of electron transport in bulk Si and deep–submicron MOSFET's" Computatural Electronics, 2000, Book of Abstracts, IWCE Glasgow 2000, $7^{th}$ Int'Workshop on, 2000; pp. 64–65.

S.S. Lu, et al.; "Piezoelectric field effect transistor (PEFET) using $In_{0.2}Ga_{0.8}As/Al_{0.35}Ga_{0.65}As/In_{0.2}Ga_{0.8}As/GaAs$ Strained layer structure on (111)B GaAs substrate"; Electronics Letters, $12^{th}$ Ma 1994, vol. 30, No. 10; pp. 823–825.

Kihong Kim, et al. "On–Chip Wirless Interconnection with Integrated Antennas"; 2000 IEEE; pp. 20.2.1–20.3.4.

G. Passiopoulos, et al.; "V–Band Single Chip, Direct Carrier BPSK Modulation Transmitter with Integrated Patch Antenna"; 1998 IEEE MTT–S Digest; pp. 305–308.

Mau–Chung Frank Chang, et al.; "RF/Wireless Interconnect for Inter–and Intra–Chip Communications"; Proceedings of the IEEE, vol. 89, No. 4, Apr. 2001; pp. 456–466.

The Electronics Industry Report; Prismark; 2001; pp. 111–120.

J.K. Abrokwah, et al.; "A Manufacturable Complementary GaAs Process"; GaAs IC Symposium, IEEE, 1993; pp. 127–130.

H. Nagata, "A Preliminary Considerations of the Growth Behaviour of $CeO_2$ $SrTiO_3$ Films on Si Substrate," *Thin Solid Films*, 224, 1993, pp. 1–3.

Nagata et al., "Heteroepitaxial Growth of $CeO_2(001)$ Films on Si(001) Substrates by Pulsed Laser Depostition in Ultra–high Vacuum," *Jpn. Jour. Appl. Phys.*, vol. 30, No. 6B, Jun. 1991, pp. L1136–L1138.

Kado et al., "Heteroepitaxial Growth of SrO Films on Si Substrates," *J. Appl. Phys.*, 61(6), Mar. 15, 1987, pp. 2398–2400.

H. Ishiwara et al., "Epitaxial Growth of Perovskite Type Oxide Films on Substrates"; *Materials Research Symposium Proceedings*, vol. 220, pp. 595–600, Apr. 29 –May 3, 1991.

J.K. Abrokwah, et al.; "A Manufacturable High–Speed Low–Power Complementary GaAs Process"; Extended Abstracts of the 1994 International Conference on Solid State Devices and Materials, Yokohama, 1994, pp. 592–594.

C.J. Palmstrom et al.; "Stable and Epitaxial Contacts to III–V Compound Semiconductors"; Contacts to Semiconductors Fundamentals and Technology; Noyles Publications, 1993; pp. 67–150.

Jayshri Sabarinathat, et al.; "Submicron three–dimensional infrared $GaAs/Al_xO_y$–based photonic crystal using single–step epitaxial growth"; Applied Physics Letters, vol. 78, No. 2, May 14, 2001; pp. 3024–3026.

Philip Ball; "The Next Generation of Optical Fibers"; Technology Review, May 2001; pp. 55–61.

John D. Joannopoulos, et al.; "Molding the Flow of Light"; Photonic Crystals; Princeton University Press, 1995.

Thomas F. Krauss, et al.; "Photonic crystals in the optical regime –past, present and future"; Progress in Quantum Electronics 23 (1999) 51–96.

G. H. Jin, et al.; "PLZT Film Waveguide Mach–Zehnder Electrooptic Modulator"; Journal of Lightwave Technology, vol. 18, No. 6, Jun. 2000; pp. 807–812.

D.E. Aspnes, et al.; "Steps on (001) silicon surfaces"; J. Vac. Sci. Technol. B, vol. 5, No. 4, Jul./Aug. 1987; pp. 939–944.

D.M. Newns, et al.; "Mott transition field effect transistor"; Applied Physics Letters, vol. 73, No. 6, Aug. 10, 1998; pp. 780–782.

Lucent Technologies, Inc. "Arrayed Waveguide Grating Multiplexer/Demultiplexer"; Jan. 2000; 4 pages.

Hisashi Shichijo, et al.; "Co–Integration of GaAs MESFET and Si CMOS Circuits"; IEEE Electron Device Letters, vol. 9, No. 9, Sep. 1988; pp. 444–446.

H. Shichijo, et al.; "GaAs MESFET and Si CMOS Cointegration and Circuit Techniques"; 1988 IEEE; GaAs IC Symposium –239–242.

H. Shichijo, et al.; "Monolithic Process for Co–Integration of GaAs and Silicon Circuits"; 1988 IEEE; pp. 778–781.

Z.H. Zhu, et al. "Growth of InGaAs multi–quantum wells at 1.3 m wavelength on GaAs compliant substrates"; Applied Physics Letters, vol. 72, No. 20, May 18, 1998; pp. 2598–2600.

Kurt Eisenbeiser, et al.; "Metamorphic InAlAs/InGaAs Enhancement Mode HEMT's on GaAs Substrates"; IEEE Electron Device Letters, vol. 20, No. 10, Oct. 1999; pp. 507–509.

Tomonori Nagashima, et al.; "Three–Terminal Tandem Solar Cells With a Back–Contact Type Bottom Cell" Higashifuji Technical Center, Toyota Motor Corporation; 4 pages.

James Schellenberg, et al.; "Low–Loss, Planar Monolithic Baluns for K/Ka–Band Applications"; 1999 IEEE MTT–S Digest; pp. 1733–1736.

Patent Abstracts of Japan, vol. 012, No. 077, Mar. 10, 1988 & JP 62 216600, Sep. 24, 1987.

R.D. Vispute; "High quality optoelectronic grade epitaxial AIN films on $-Al_2O_3$, Si and 6H–SiC by pulsed laser deposition"; Thin Solid Films 299 (1997), pp. 94–103.

T. Warren Weeks, et al.; "GaN thin films deposited via organometallic vapor phase epitaxy on (6H)–SiC(0001) using high–temperature monocrystalline AIN buffer layers" 320 Applied Physics Letters, vol. 67, No. 3, Jul. 17, 1995, pp. 1401–403.

Z. Yu, et al.; "Epitaxial oxide thin films on Sl(001)*"; J. Vac. Sci. Technol. B. vol. 18, No. 4, Jul./Aug. 2000; pp. 2139–2145.

Gentex Corporate Website; Photoelectric Smoke Detectors –How They Work; 2001.

Jeffrey B. Casady, et al.; "A Hybrid 6H–SiC Temperature Sensor Operational from 25 C to 500 C"; IEEE Transactions on Components, Packaging, and Manufacturing Technology –Part A, vol. 19, No. 3, Sep. 1996; pp. 416–422.

Ronald W. Waynant, et al.; "Optoelectronics Integrated Circuits"; Electro–Optics Handbook, McGraw–Hill, Inc., 1994; Chapter Twenty Seven.

Antonio Mecozzi, et al.; "The Roles of Semiconductor Optical Amplifiers in Optical Networks"; Optics & Photonics News; Mar. 2001; pp. 37–42.

D.A. Francis, et al.; "A single–chip linear optical amplifier"; OFC, 2001; Mar. 17–22, 2001.

Patent Abstracts of Japan, vol. 015, No. 098, Mar. 8, 1991 & JP 02 306680. Dec. 20, 1990.

Peter S. Guilfoyle, et al.; "Optoelectronic Architecture for High–Speed Switching and Processing Applications"; 1998 The Photonics Design and Applications Handbook; pp. H–399–H–406.

Gerald B. Stringfellow; "Organometallic Vapor–Phase Epitaxy: Theory and Practice"; Departments of Materials Science and Engineering and Electrical Engineering, University of Utah; Academic Press, 1989.

M.A. Herman, et al.; "Molecular Beam Epitaxy Fundamentals and Current Status"; Springer–Verlag Berlin Heidelberg, 1989, 1996.

"Integration of GaAs on Si Using a Spinel Buffer Layer", IBM Technical Bulletin, vol. 30, No. 6, Nov. 1987, p. 365.

"GaInAs Superconducting FET," IBM Technical Bulletin, vol. 36, No. 8, Aug. 1993, pp. 655–656.

"Epitaxial 3d Structure Using Mixed Spinels," IBM Technical Bulletin, vol. 30, No. 3, Aug. 1987, p. 1271.

Moon et al., "Roles of Buffer Layers in Epitaxial Growth of $SrTiO_3$ Films on Silicon Substrates," *Japan J of Appl. Phys.*, vol. 33, Mar. 1994, pp. 1472–1477.

Yodo et al., GaAs Heteroepitaxial Growth on Si Substrates with Thin Si Interlayers *in situ* Annealed at High Temperatures, 8257b *Journal of Vacuum Science & Technology*, 1995 May/Jun., vol. 13, No. 3, pp. 1000–1005.

Cuomo et al., "Substrate Effect on the Superconductivity of $YBa_2Cu_3O_7$ Thin Films," AIP Conference 1988, pp. 141–148.

McKee et al., "Crystalline Oxides on Silicon: The First Five Monolayers," *Physical Review Letters*, vol. 18, No. 14, Oct. 1998, pp. 3014–3017.

McKee et al., "Molecular Beam Epitaxy Growth of Epitaxial Barium Silicide, Barium Oxide, and Barium Titanate on Silicon," 1991 *American Institute of Physics*, pp. 782–784, Aug. 13, 1991.

Tambo et al., Molecular Beam Epitaxy Growth of $SrTiO_3$ Films on Si(100)–2x1 with SrO Buffer Layer, *Jpn. J. Appl. Phys.*, vol. 37, 1998, pp. 4454–4459.

McKee et al., "The MBE Growth and Optical Quality of $BaTiO_3$ and $SrTiO_3$ Thin Films on MgO," *Mat. Res. Soc. Symp. Proc.*, vol. 341, Apr. 1994, pp. 309–314.

McKee et al., "$BaSi_2$ and Thin Film Alkaline Earth Silicides on Silicon," *Appl. Phys. Lett.*, 63 (20), Nov. 1993, pp. 2818–2820.

McKee et al., "Surface Structures and the Orthorhombic Transformation of Thin Film $BaSi_2$ on Silicon," *Mat. Res. Soc. Symp. Proc.*, vol. 221, pp. 131–136.

Brian A. Floyd, et al.; "The projected Power Consumption of a Wireless Clock Distribution System and Comparison to Conventional Distribution Systems"; IEEE, 1999; pp. IITC99–249–IITC99–250.

Mori et al., "Epitaxial Growth of $SrTiO_3$ Films on Si(100) Substrates Using a Focused Electron Beam Evaporation Method," *Jpn. J. of Apl. Phys.*, vol. 30, No. 8A, Aug. 1991, pp. L1415–L1417.

Moon et al., "Growth of Crystalline $SrTiO_3$ Films on Si Substracts Using Thin Fluoride Buffer Layers and Their Electrical Properties," *Jpn. J. of Appl. Phys.*, vol, 33, (1994), pp. 5911–5916.

Farrow et al., "Heteroepitaxy of Dissimilar Materials," *Mat. Res. Soc. Symposium Proceedings*, vol. 221, pp. 29–34, Apr. 29 –May 2, 1991.

Ishiwara et al., "Heteroepitaxy on Silicon: Fundamentals, Structure, and Devices," *Mat. Res. Soc.*, Symposium Proceedings, vol. 116, pp. 369–374, Apr. 5–8, 1988.

Douglas B. Chrisey, et al; Pulsed Laser Deposition of Thin Films; pp. 273–285.

B.A. Block, et al; "Photoluminescence properties of $Er^3$–doped $BaTiO_3$ thin films"; Appl. Phys. Lett. 65 (1), Jul. 4, 1994, pp. 25–27.

Kevin J. Chen et al; "A Novel Ultrafast Functional Device: Resonant Tunneling High Electron Mobility Transistor"; Electron Devices Meetingk 1996; IEEE Hong Kong; Jun. 29, 1996; pp. 60–63, XP010210167.

Wenhua Zhu et al.; "Molecular Beam Epitaxy of GaAs on Si–on–Insulator"; 320 Applied Physics Letters 56(1991) Jul. 8 No. 2; pp. 210–212.

Umesh K. Mishra et al; "Oxide Based Compound Semiconductor Electronics"; Electron Devices Meeting; 1997; Technical Digest, International; Washington, D.C.; Dec. 7–10, 1997; pp. 545–548.

J.M. Daughton et al.; "Applications of Spin Dependent Transport Materials"; J. Phys. D. Appl. Phys. 32(1999) R169–R177.

Wei Zhang et al.; "Stress Effect and Enhanced Magnetoresistance in $La_{0.67}Ca_{0.33}MnO_{3-\delta}$ Films"; Physical Review, B. Condensed Matter; American Institute of Physics; vol. 58, No. 21, Part 1; Dec. 1, 1998; pp. 14143–14146.

Q.–Y. Tong et al.; "IOS–a new type of materials combination for system–on–a–chip preparation"; 1999 IEEE International SOI Conference, Oct. 1999; pp. 104–105.

T. Kanniainen et al.; "Growth of Dielectric 1hfo2/Ta205 Thin Film Nanolaminate Capacitors By Atomic Layer Epitaxy"; Electrochemical Society Proceedings, U.S. Electrochemical Society; Pennington, N.J.; Aug. 31, 1997; pp. 36–46.

Myung Bok Lee; "Heteroepitaxial Growth of $BaTio_3$ Films on Si by Pulsed Laser Deposition"; Applied Physics Letters; Mar. 13, 1995; pp. 1331–1333.

Myung Bok Lee; "Formation and Characterization of Epitaxial $TiO_2$ and $BaTiO_3/TiO_2$ Films on Si Substrate"; Japan Journal Applied Physics Letters; vol. 34; 1995; pp. 808–811.

Gilbert Lecarpentier et al.; "High Accuracy Machine Automated Assembly for Opto Electronics"; 2000 Electronic Components and Technology Conference; pp. 1–4.

R. Ramesh; "Ferroelectric La–Sr–Co–O/Pb–Zr–Ti–O/La–S-r–Co–O Heterostructures on Silicon via Template Growth"; 320 Applied Physics Letters; 63(1993); Dec. 27; No. 26; pp. 3592–3594.

K. Eisenbeiser; "Field Effect Transistors with $SrTiO_3$ Gate Dielectric on Si"; Applied Physics Letters; vol. 76, No. 10; Mar. 6, 2000; pp. 1324–1326.

Stephen A. Mass; "Microwave Mixers"; Second Edition; 2 pp.

Douglas J. Hamilton et al.; "Basic Integrated Circuit Engineering"; p. 2; 1975.

Takeshi Obata; "Tunneling Magnetoresistance at Up to 270 K in $La_{0.8}Sr_{0.2}MnO_3/La_{0.8}Sr_{0.2}MnO_3$ Junctions with 1.6–nm–Thick Barriers"; Applied Physics Letters; vol. 74, No. 2; Jan. 11,1999;pp. 290–292.

Wei Zhang et al.; "Enhanced Magnetoresistance in La–Ca–Mn–O Films on Si Substrates Using $YbaCuO/CeO_2$ Heterostructures"; Physica C; vol. 282–287, No. 2003; Aug. 1, 1997; pp. 1231–1232.

Shogo Imada et al; "Epitaxial Growth of Ferroelectric $YmnO_3$ Thin Films on Si (111) Substrates by Molecular Beam Epitaxy"; Jpn. J. Appl. Phys. vol. 37 (1998); pp. 6497–6501; Part 1, No. 12A, Dec. 1998.

Ladislav Pust et al.; "Temperature Dependence of the Magnetization Reversal in Co(fcc)–BN–Co(poly hcp) Structures"; Journal of Applied Physics; vol. 85, No. 8; Apr. 15, 1999; pp. 5765–5767.

C. Martinez; "Epitaxial Metallic Nanostructures on GaAs"; Surface Science; vol. 482–485; pp. 910–915; 2001.

Wen–Ching Shih et al.; "Theoretical Investigation of the SAW Properties of Ferroelectric Film Composite Structures"; IEEE Transactions of Ultrasonics, Ferroelectrics, and Frequency Control; vol. 45, No. 2; Mar. 1998; pp. 305–316.

Zhu Dazhong et al.; "Design of ZnO/SiO$_2$/Si Monolithic Integrated Programmable SAW Filter"; Proceedings of Fifth International Conference on Solid–State and Integrated Circuit Technology; 21–23; Oct. 1998; pp. 826–829.

Kirk–Othmer Encyclopedia of Chemical Technology; Fourth Edition, vol. 12; Fuel Resources to Heat Stabilizers; A Wiley–Interscience Publication; John Wiley & Sons.

John W. Goodman et al; "Optical Interconnections For VLSI Systems"; Proceedings of the IEEE, vol. 72, No. 7, Jul. 1984.

Fathimulla et al.; "Monolithic Integration of InGaAs/InAlAs MODFETs and RTDs on InP–bonded–to Si Substrate"; Fourth International Conference on Indium Phosphide and Related Materials, Newport, RI, USA; Apr. 21–24, 1992; pp. 167–170; XP000341253; IEEE, New York, NY, USA; ISBN: 0–7803–0522–1.

H. Takahashi et al.; "Arraryed–Waveguide Grating For Wavelength Division Multi/Demultiplexer With Nanometre REsolution"; Electronics Letters; vol. 26., No. 2, Jan. 18th 1990.

Pierret, R.F.; "1/J–Fet and MESFET"; Field Effect Devices; MA, Addison–Wesley; 1990; pp. 9–22.

M. Schreiter, et al.; "Sputtering of Self–Polarized PZT Films for IR–Detector Arrays"; 1998 IEEE; pp. 181–185.

Hideaki Adachi et al.; "Sputtering Preparation of Ferroelectric PLZT Thin Films and Their Optical Applications"; IEEE Transactions of Ultrasonics. Ferroelectrics and Frequency Control, vol. 38, No. 6, Nov. 1991.

A.J. Moulson et al.; "Electroceramics Materials Properties Applications"; Chapman & Hall; pp. 366–369.

P.A. Langjahr et al.; "Epitaxial Growth and Structure of Cubic and Pseudocubic Perovskite Films on Perovskite Substrates"; Mat. Res. Soc. Symp. Proc., vol. 401; 1995 Materials Research Society; pp. 109–114.

Wang et al.; "Depletion–Mode GaAs MOSFETs with Negligible Drain Current Drift and Hysteresis"; Electron Devices Meeting, 1998, IEDM '98 Technical Digest; pp. 67–70.

Ben G. Streetman; "Solid State Electronic Devices"; 1990, Prentice Hall; Third Edition; pp. 320–322.

A.Y Wu et al.; "Highly Oriented (Pb,La)(Zr,Ti)O$_3$ Thin Films on Amorphous Substrates"; IEEE, 1992; pp. 301–304.

Timothy E. Glassman et al.; "Evidence for Cooperative Oxidation of MoCVD Precursors Used in Ba$_x$Sr$_{1-x}$TiO$_3$ Film Growth"; Mat. Res. Soc. Symp. Proc. vol. 446, 1997 Materials Research Society; pp. 321–326.

S.N. Subbarao et al.; "Monolithic PIN Photodetector and FET Amplifier on GaAs–os–Si"; IEEE; GaAs IC Symposium–163–166; 1989.

T.A. Langdo et al.; "High Quality Ge on Si by Epitaxial Necking"; Applied Physics Letters; vol. 76, No. 25; pp. 3700–3702; Jun. 19, 2000.

Chenning Hu et al.; Solar Cells From Basics to Advanced Systems; McGraw–Hill Book Company; 1983.

O.J. Painter et al; "Room Temperature Photonic Crystal Defect Lasers at Near–Infrared Wavelengths in InGaAsp"; Journal of Lightwave Technology, vol. 17, No. 11; Nov. 1999.

C. Donn et al.; "A 16–Element, K–Band Monolithic Active Receive Phased Array Antenna"; Antennas and Propagation Society International Symposium, 1988; pp. 188–191, vol. 1; Jun. 6–10, 1988.

Don W. Shaw; "Epitaxial GaAs on Si: Progress and Potential Applications"; Mat. Res. Soc. Symp. Proc.; pp. 15–30; 1987.

G.J.M. Dormans, et al.; "PbTiO/$_3$/Thin Films Grown by Organometallic Chemical Vapour Deposition"; Third International Symposium on Integrated Ferroelectrics; Apr. 3–5, 1991 (Abstract).

P.J. Borrelli et al.; "Compositional and Structural Properties of Sputtered PLZT Thin Films"; Ferroelectric Thin Films II Symposium; Dec. 2–4, 1991 (Abstract).

Ranu Nayak et al; "Enhanced acousto–optic diffraction efficiency in a symmetric SrRiO3/BaTiO3/SrTiO3 thin–film heterostructure"; Nov. 1, 2000; vol. 39, No. 31; Applied Optics; pp. 5847–5853.

Ranu Nayak et al; "Studies on acousto–optical interaction in SrTiO3/BaTiO3/SrTiO3 epitaxial thin film heterostructures"; J. Phys. D: Appl. Phys. 32 (1999) 380–387.

* cited by examiner

ACOUSTIC WAVE DEVICE AND PROCESS FOR FORMING THE SAME

FIELD OF THE INVENTION

This invention relates generally to microelectronic structures and devices and to a method for their fabrication, and more specifically to acoustic wave devices and to the fabrication and use of acoustic wave devices, and to monolithic integrated circuits that include acoustic wave devices.

BACKGROUND OF THE INVENTION

Acoustic wave devices have several applications in the microelectronics industry. For example, acoustic wave devices can be used to perform active or passive signal processing functions suitable for delay lines, attenuators, phase shifters, filters, amplifiers, oscillators, mixers, limiters, and the like. Such acoustic wave devices are often integrated with other microelectronic components such as integrated circuits and RF generators to form assemblies for telecommunication, digital processing, and other applications.

Acoustic wave devices, such as surface acoustic wave and bulk acoustic wave devices, include a transducer coupled to piezoelectric material that converts an electronic signal received from the transducer to an acoustic wave. The acoustic wave devices are often fabricated by forming the transducer on bulk piezoelectric material or on a thin-film of piezoelectric material formed over a substrate such as a sapphire. Attempts have also been made to grow thin-film piezoelectric material over a semiconductor substrate. Formation of such films on semiconductor substrates is desirable because it allows for integration of the acoustic wave devices with other microelectronic devices on a single substrate. However, thin films of piezoelectric material formed on the semiconductor substrate are often of lesser quality than the bulk material because lattice mismatches between the host crystal and the grown crystal cause the grown thin film of piezoelectric material to be of low crystalline quality.

Generally, the desirable characteristics of acoustic wave devices increase as the crystallinity of the piezoelectric film increases. For example, the electromechanical coupling coefficient and the piezoelectric coefficient of a monocrystalline piezoelectric material is typically higher than the coefficient of the same material in polycrystalline or amorphous form. Accordingly, methods for forming monocrystalline piezoelectric films are desirable.

If a large area thin film of high quality monocrystalline piezoelectric material was available at low cost, a variety of semiconductor devices could advantageously be fabricated using that film at a low cost compared to the cost of fabricating such devices on a bulk wafer of the piezoelectric material or in an epitaxial film of such material on a sapphire substrate. In addition, if a thin film of high quality monocrystalline piezoelectric material could be realized on a bulk wafer such as a silicon wafer, an integrated device structure could be achieved that took advantage of the best properties of both the silicon and the piezoelectric material.

Accordingly, a need exists for a microelectronic structure that provides a high quality monocrystalline piezoelectric film over another monocrystalline material such as a semiconductor wafer and for a process for making such a structure.

BRIEF DESCRIPTION OF THE DRAWINGS

The present invention is illustrated by way of example and not limitation in the accompanying figures, in which like references indicate similar elements, and in which.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION OF THE DRAWINGS

Figure 1:
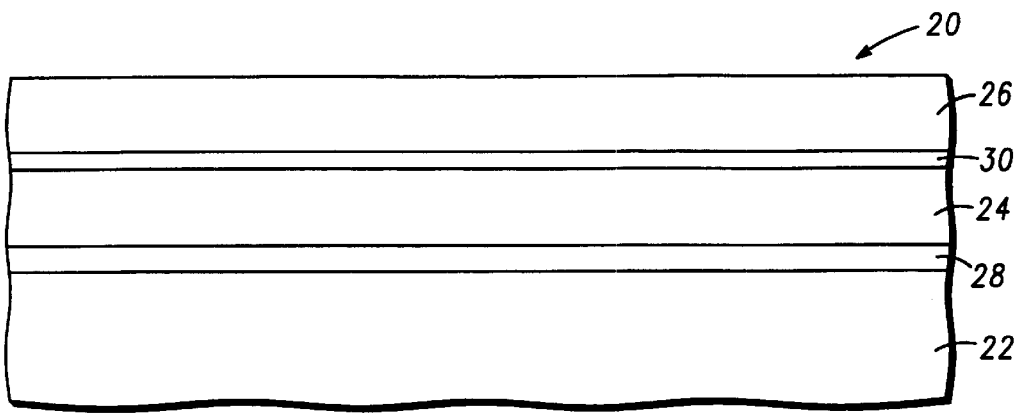
FIGS. 1–4 illustrate schematically, in cross section, device structures in accordance with various embodiments of the invention.

FIG. 1 illustrates schematically, in cross section, a portion of a microelectronic structure 20 in accordance with an embodiment of the invention. Microelectronic structure 20 includes a monocrystalline substrate 22, an accommodating buffer layer 24 comprising a monocrystalline material, and a layer 26 of piezoelectric material, which is preferably monocrystalline. In this context, the term "monocrystalline" shall have the meaning commonly used within the semiconductor industry. The term shall refer to materials that are a single crystal or that are substantially a single crystal and shall include those materials having a relatively small number of defects such as dislocations and the like as are commonly found in substrates of silicon or germanium or mixtures of silicon and germanium and epitaxial layers of such materials commonly found in the semiconductor industry.

In accordance with one embodiment of the invention, structure 20 also includes an amorphous intermediate layer 28 positioned between substrate 22 and accommodating buffer layer 24. Structure 20 may also include a template layer 30 between the accommodating buffer layer and piezoelectric material layer 26. As will be explained more fully below, the template layer helps to initiate the growth of the piezoelectric material layer on the accommodating buffer layer. The amorphous intermediate layer helps to relieve the strain in the accommodating buffer layer and, by doing so, aids in the growth of a high crystalline quality accommodating buffer layer.

Substrate 22, in accordance with an embodiment of the invention, is a monocrystalline semiconductor wafer, preferably of large diameter. The wafer can be of a material from Group IV of the periodic table, and preferably a material from Group IVA. Examples of Group IV semiconductor materials include silicon, germanium, mixed silicon and germanium, mixed silicon and carbon, mixed silicon, germanium and carbon, and the like. Substrate 22 can also be of a compound semiconductor material. The compound semiconductor material of substrate 22 can be selected, as needed for a particular semiconductor structure, from any of the Group IIIA and VA elements (III–V semiconductor compounds), mixed III–V compounds, Group II(A or B) and VIA elements (II–VI semiconductor compounds), and mixed II–VI compounds. Examples include gallium arsenide (GaAs), gallium indium arsenide (GaInAs), gallium aluminum arsenide (GaAlAs), indium phosphide (InP), cadmium sulfide (CdS), cadmium mercury telluride (CdHgTe), zinc selenide (ZnSe), zinc sulfur selenide (ZnSSe), and the like.

Preferably, substrate 22 is a wafer containing silicon or germanium, and most preferably is a high quality monocrystalline silicon wafer as used in the semiconductor industry. Accommodating buffer layer 24 is preferably a monocrystalline oxide or nitride material epitaxially grown on the underlying substrate. In accordance with one embodiment of the invention, amorphous intermediate layer 28 is grown on substrate 22 at the interface between substrate 22 and the growing accommodating buffer layer by the oxidation of substrate 22 during the growth of layer 24. The amorphous intermediate layer serves to relieve strain that might otherwise occur in the monocrystalline accommodating buffer layer as a result of differences in the lattice constants of the substrate and the buffer layer. As used herein, lattice constant refers to the distance between atoms of a cell measured in the plane of the surface. If such strain is not relieved by the amorphous intermediate layer, the strain may cause defects in the crystalline structure of the accommodating buffer layer. Defects in the crystalline structure of the accommodating buffer layer, in turn, would make it difficult to achieve a high quality crystalline structure in piezoelectric material layer 26.

Accommodating buffer layer 24 is preferably a monocrystalline oxide or nitride material selected for its crystalline compatibility with the underlying substrate and with the overlying piezoelectric material. For example, the material could be an oxide or nitride having a lattice structure substantially matched to the substrate and to the subsequently applied piezoelectric material. Materials that are suitable for the accommodating buffer layer include metal oxides such as the alkaline earth metal titanates, alkaline earth metal zirconates, alkaline earth metal hafnates, alkaline earth metal tantalates, alkaline earth metal ruthenates, alkaline earth metal niobates, alkaline earth metal vanadates, perovskite oxides such as alkaline earth metal tin-based perovskites, lanthanum aluminate, lanthanum scandium oxide, and gadolinium oxide. Additionally, various nitrides such as gallium nitride, aluminum nitride, and boron nitride may also be used for the accommodating buffer layer. Most of these materials are insulators, although strontium ruthenate, for example, is a conductor. Generally, these materials are metal oxides or metal nitrides, and more particularly, these metal oxide or nitrides typically include at least two different metallic elements and have a perovskite crystal lattice structure. In some specific applications, the metal oxides or nitride may include three or more different metallic elements.

Amorphous interface layer 28 is preferably an oxide formed by the oxidation of the surface of substrate 22, and more preferably is composed of a silicon oxide. The thickness of layer 28 is sufficient to relieve strain attributed to mismatches between the lattice constants of substrate 22 and accommodating buffer layer 24. Typically, layer 28 has a thickness in the range of approximately 0.5–5 nm.

The piezoelectric material of layer 26 can be selected, as desired for a particular structure or application. Exemplary materials suitable for piezoelectric material layer 26 include lead based perovskite materials such as $Pb(Zr,Ti)O_3$ and other oxides such as $LiNbO_3$, $LiTaO_3$, and ZnO.

Suitable template materials chemically bond to the surface of the accommodating buffer layer 24 at selected sites and provide sites for the nucleation of the epitaxial growth of the subsequent piezoelectric material layer 26. When used, template layer 30 has a thickness ranging from about one to about ten monolayers.

Figure 2:
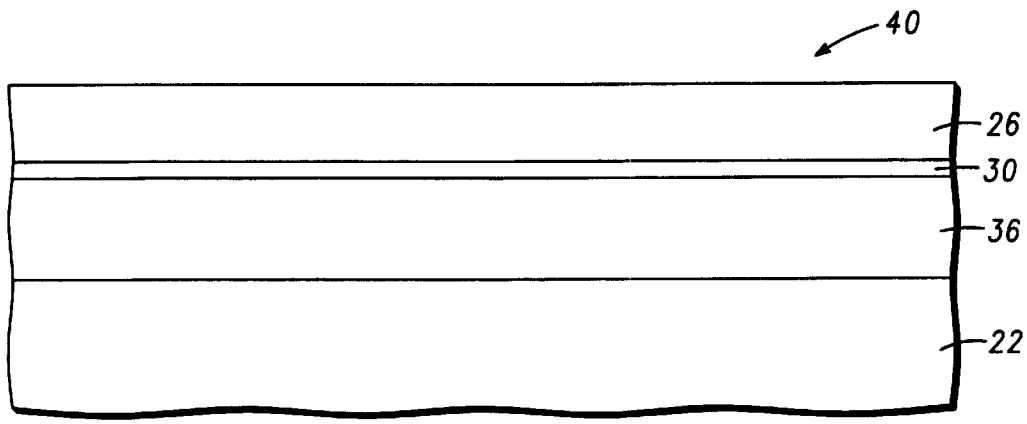

FIG. 2 schematically illustrates, in cross section, a portion of a microelectronic structure 40 in accordance with another exemplary embodiment of the invention. Structure 40 is similar to structure 20, except that structure 40 includes an amorphous layer 36, rather than accommodating buffer layer 24 and amorphous interface layer 28.

As explained in greater detail below, amorphous layer 36 may be formed by first forming an accommodating buffer layer and an amorphous interface layer in a similar manner to that described above. Additional buffer layer 32 is then formed (by epitaxial growth) overlying the monocrystalline accommodating buffer layer. The accommodating buffer layer is then exposed to an anneal process to convert the monocrystalline accommodating buffer layer to an amorphous layer. Amorphous layer 36 formed in this manner comprises materials from both the accommodating buffer and interface layers, which amorphous layers may or may not amalgamate. Thus, layer 36 may comprise one or two amorphous layers. Formation of amorphous layer 36 between substrate 22 and layer 26 relieves stresses between layers 22 and 26 and provides a true compliant substrate for subsequent processing.

The process previously described above in connection with FIG. 1 is adequate for growing monocrystalline piezoelectric material layers over a monocrystalline substrate. However, the process described in connection with FIG. 2, which includes transforming a monocrystalline accommodating buffer layer to an amorphous oxide layer, may be better for growing monocrystalline piezoelectric material layers because it allows strain in the structure to relax.

Figure 3:
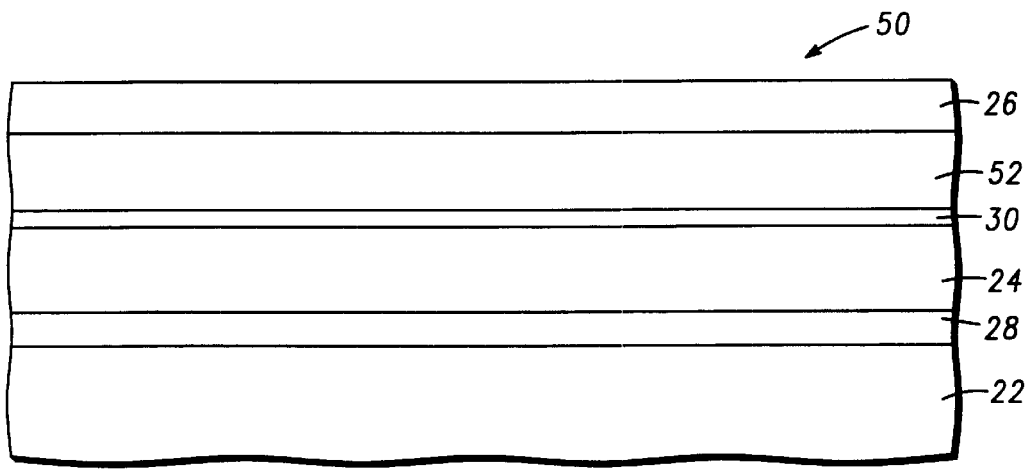

FIG. 3 schematically illustrates, in cross section, a portion of a microelectronic structure 50 in accordance with another exemplary embodiment of the invention. Structure 50 is similar to structure 20, except that structure 50 includes an additional conductive layer 52 interposed between piezoelectric material layer 26 and template layer 30.

Figure 4:
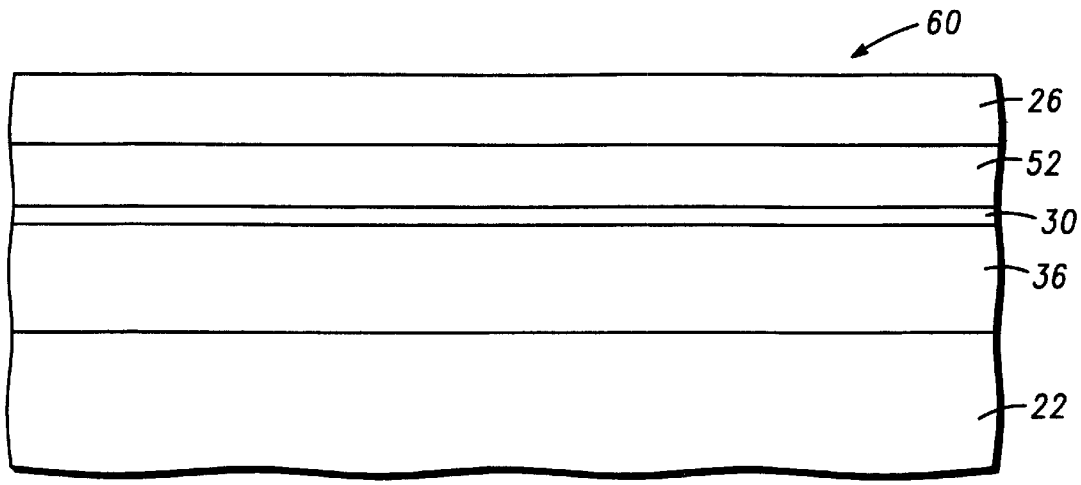

FIG. 4 schematically illustrates, in cross section, a portion of a microelectronic structure 60 in accordance with yet another exemplary embodiment of the invention. Structure 60 is similar to structure 40, except that structure 60 includes conductive oxide layer 52.

Conductive layer 52 is preferably formed of monocrystalline material such that piezoelectric material 26 may be epitaxially formed over layer 52. Suitable layer 52 materials that can be epitaxially grown over layer 24 include conductive oxides such as strontium ruthenate, strontium vanadate, and $(La,Sr)CoO_3$.

The following non-limiting, illustrative examples illustrate various combinations of materials useful in structures 20, 40, 50, and 60 in accordance with various alternative embodiments of the invention. These examples are merely illustrative, and it is not intended that the invention be limited to these illustrative examples.

EXAMPLE 1

In accordance with one embodiment of the invention, illustrated in FIG. 1, monocrystalline substrate 22 is a silicon substrate oriented in the (100) direction. The silicon substrate can be, for example, a silicon substrate as is commonly used in making complementary metal oxide semiconductor (CMOS) integrated circuits having a diameter of about 200–300 mm. In accordance with this embodiment of the invention, accommodating buffer layer 24 is a monocrystalline layer of (Sr,Ba)TiO$_3$ and the amorphous intermediate layer is a layer of silicon oxide (SiO$_x$) formed at the interface between the silicon substrate and the accommodating buffer layer. The composition of layer 24 is selected to obtain one or more lattice constants closely matched to corresponding lattice constants of the subsequently formed layer 26. The accommodating buffer layer can have a thickness of about 2 to about 100 nanometers (nm) and preferably has a thickness of about 10 nm. In general, it is desired to have an accommodating buffer layer thick enough to isolate the piezoelectric layer from the substrate to obtain the desired properties. Layers thicker than 100 nm usually provide little additional benefit while increasing cost unnecessarily; however, thicker layers may be fabricated if needed. The amorphous intermediate layer of silicon oxide can have a thickness of about 0.5–5 nm, and preferably a thickness of about 1.5–2.5 nm.

In accordance with this embodiment of the invention, piezoelectric material layer 26 is a layer of (Pb,Zr)TiO$_3$ having a thickness of about 100 nm to several microns and preferably a thickness of about 100–5000 nm. The thickness generally depends on the application for which the layer is being prepared.

EXAMPLE 2

In accordance with another embodiment of the invention, illustrated in FIGS. 3 and 4, a structure is provided that is suitable for the growth of a piezoelectric film over a conductive oxide material. The substrate is preferably a silicon wafer as described above. A suitable accommodating buffer layer material is (Sr,Ba)TiO$_3$, having a thickness of about 2–100 nm and preferably a thickness of about 5–15 nm. The piezoelectric material can be, for example (Pb,Zr)TiO$_3$, having a thickness of about 100 nm to about 5000 nm. Conductive layer 52 material includes (La,Sr)CoO$_3$, and the layer is about 100 nm–1000 nm thick.

Referring again to FIGS. 1–4, substrate 22 is a monocrystalline substrate such as a monocrystalline silicon or gallium arsenide substrate. The crystalline structure of the monocrystalline substrate is characterized by a lattice constant and by a lattice orientation. In similar manner, accommodating buffer layer 24 is also a monocrystalline material and the lattice of that monocrystalline material is characterized by a lattice constant and a crystal orientation. The lattice constants of the accommodating buffer layer and the monocrystalline substrate must be closely matched or, alternatively, must be such that upon rotation of one crystal orientation with respect to the other crystal orientation, a substantial match in lattice constants is achieved. In this context the terms "substantially equal" and "substantially matched" mean that there is sufficient similarity between the lattice constants to permit the growth of a high quality crystalline layer on the underlying layer.

Figure 5:
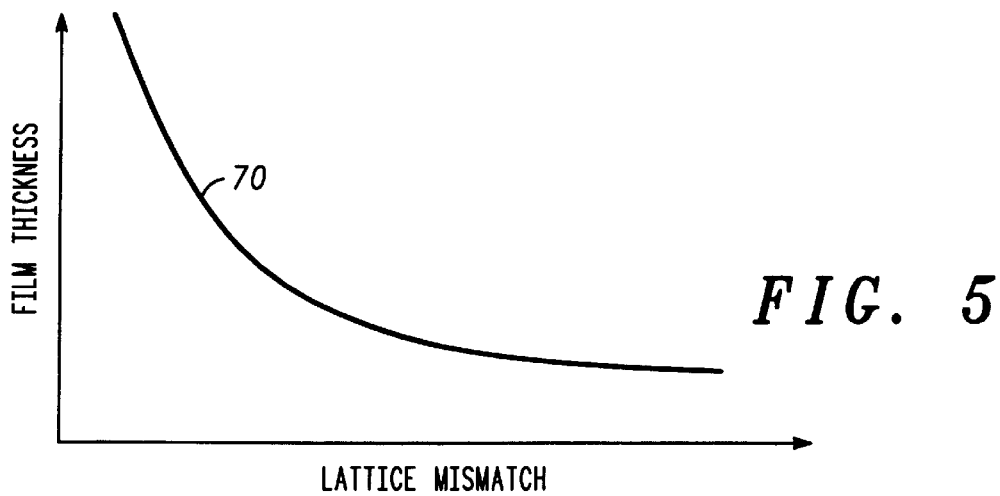
FIG. 5 illustrates graphically the relationship between maximum attainable film thickness and lattice mismatch between a host crystal and a grown crystalline overlayer.

FIG. 5 graphically illustrates the relationship of the achievable thickness of a grown crystal layer of high crystalline quality as a function of the mismatch between the lattice constants of the host crystal and the grown crystal. Curve 70 illustrates the boundary of high crystalline quality material. The area to the right of curve 70 represents layers that have a large number of defects. With no lattice mismatch, it is theoretically possible to grow an infinitely thick, high quality epitaxial layer on the host crystal. As the mismatch in lattice constants increases, the thickness of achievable, high quality crystalline layer decreases rapidly. As a reference point, for example, if the lattice constants between the host crystal and the grown layer are mismatched by more than about 2%, monocrystalline epitaxial layers in excess of about 20 nm cannot be achieved.

In accordance with one embodiment of the invention, substrate 22 is a (100) or (111) oriented monocrystalline silicon wafer and accommodating buffer layer 24 is a layer of strontium barium titanate. Substantial matching of lattice constants between these two materials is achieved by rotating the crystal orientation of the titanate material by 45° with respect to the crystal orientation of the silicon substrate wafer. The inclusion in the structure of amorphous interface layer 28, a silicon oxide layer in this example, if it is of sufficient thickness, serves to reduce strain in the titanate monocrystalline layer that might result from any mismatch in the lattice constants of the host silicon wafer and the grown titanate layer. As a result, in accordance with an embodiment of the invention, a high quality, thick, monocrystalline titanate layer is achievable.

Referring now to FIGS. 1–2, layer 26 is a layer epitaxially grown piezoelectric material and that crystalline material is also characterized by a crystal lattice constant and a crystal orientation. In accordance with one embodiment of the invention, the lattice constant of layer 26 differs from the lattice constant of substrate 22. To achieve high crystalline quality in this epitaxially grown monocrystalline layer, the accommodating buffer layer must be of high crystalline quality. In addition, in order to achieve high crystalline quality in layer 26, substantial matching between the crystal lattice constant of the host crystal, in this case, the monocrystalline accommodating buffer layer, and the grown crystal is desired. With properly selected materials, this substantial matching of lattice constants is achieved as a result of rotation of the crystal orientation of the grown crystal with respect to the orientation of the host crystal. Similarly, with reference to FIGS. 3–4, to achieve high crystalline quality of layer 26, both accommodating buffer layer 32 and conductive layer 52 must be of high crystalline quality.

The following example illustrates a process, in accordance with one embodiment of the invention, for fabricating a microelectronic structure such as the structures depicted in FIGS. 1–4. The process starts by providing a monocrystalline semiconductor substrate comprising silicon. In accordance with a preferred embodiment of the invention, the semiconductor substrate is a silicon wafer having a (100) orientation. The substrate is preferably oriented on axis or, at most, about 0.5° off axis. At least a portion of the semiconductor substrate has a bare surface, although other portions of the substrate, as described below, may encompass other structures. The term "bare" in this context means that the surface in the portion of the substrate has been cleaned to remove any oxides, contaminants, or other foreign material. As is well known, bare silicon is highly reactive and readily forms a native oxide. The term "bare" is intended to encompass such a native oxide. A thin silicon oxide may also be intentionally grown on the semiconductor substrate, although such a grown oxide is not essential to the process in accordance with the invention. In order to epitaxially grow a monocrystalline oxide layer overlying the monocrystalline substrate, the native oxide layer must first be removed to expose the crystalline structure of the underlying substrate. The following process is preferably carried out by molecular beam epitaxy (MBE), although other epitaxial processes may also be used in accordance with the present invention. The native oxide can be removed by first thermally depositing a thin layer of strontium, barium, a combination of strontium and barium, or other alkaline earth metals or combinations of alkaline earth metals in an MBE apparatus. In the case where strontium is used, the substrate is then heated to a temperature of about 750° C. to cause the strontium to react with the native silicon oxide layer. The strontium serves to reduce the silicon oxide to leave a silicon oxide-free surface. The resultant surface, which exhibits an ordered 2×1 structure, includes strontium, oxygen, and silicon. The ordered 2×1 structure forms a template for the ordered growth of an overlying layer of a monocrystalline oxide. The template provides the necessary chemical and physical properties to nucleate the crystalline growth of an overlying layer.

In accordance with an alternate embodiment of the invention, the native silicon oxide can be converted and the substrate surface can be prepared for the growth of a monocrystalline oxide layer by depositing an alkaline earth metal oxide, such as strontium oxide, strontium barium oxide, or barium oxide, onto the substrate surface by MBE at a low temperature and by subsequently heating the structure to a temperature of about 750° C. At this temperature, a solid state reaction takes place between the strontium oxide and the native silicon oxide, causing the reduction of the native silicon oxide and leaving an ordered 2×1 structure with strontium, oxygen, and silicon remaining on the substrate surface. Again, this forms a template for the subsequent growth of an ordered monocrystalline oxide layer.

Following the removal of the silicon oxide from the surface of the substrate, in accordance with one embodiment of the invention, the substrate is cooled to a temperature in the range of about 200–800° C. and a layer of strontium titanate is grown on the template layer by molecular beam epitaxy. The MBE process is initiated by opening shutters in the MBE apparatus to expose strontium, titanium and oxygen sources. The ratio of strontium and titanium is approximately 1:1. The partial pressure of oxygen is initially set at a minimum value to grow stoichiometric strontium titanate at a growth rate of about 0.3–0.5 nm per minute. After initiating growth of the strontium titanate, the partial pressure of oxygen is increased above the initial minimum value. The overpressure of oxygen causes the growth of an amorphous silicon oxide layer at the interface between the underlying substrate and the growing strontium titanate layer. The growth of the silicon oxide layer results from the diffusion of oxygen through the growing strontium titanate layer to the interface where the oxygen reacts with silicon at the surface of the underlying substrate. The strontium titanate grows as an ordered monocrystal with the crystalline orientation rotated by 45° with respect to the ordered 2×1 crystalline structure of the underlying substrate. Strain that otherwise might exist in the strontium titanate layer because of the small mismatch in lattice constant between the silicon substrate and the growing crystal is relieved in the amorphous silicon oxide intermediate layer.

After the strontium titanate layer has been grown to the desired thickness, the monocrystalline strontium titanate may be capped by a template layer that is conducive to the subsequent growth of an epitaxial layer of a desired material. For example, the MBE growth of the strontium titanate monocrystalline layer can be capped by terminating the growth with 1–2 monolayers of titanium, 1–2 monolayers of titanium-oxygen or with 1–2 monolayers of strontium-oxygen. Following the formation of the template (if one is formed), the piezoelectric or conductive oxide material is grown using MBE or other suitable techniques.

Structure 40, illustrated in FIG. 2, may be formed by growing an accommodating buffer layer and forming an amorphous oxide layer over substrate 22, as described above. The accommodating buffer layer and the amorphous oxide layer are then exposed to an anneal process sufficient to change the crystalline structure of the accommodating buffer layer from monocrystalline to amorphous, thereby forming an amorphous layer such that the combination of the amorphous oxide layer and the now amorphous accommodating buffer layer form a single amorphous oxide layer 36. Layer 26 is then subsequently grown over layer 36 (or a suitable anneal cap layer formed over layer 36). Alternatively, the anneal process may be carried out subsequent to growth of layer 26.

In accordance with one aspect of this embodiment, layer 36 is formed by exposing substrate 22, the accommodating buffer layer, and the amorphous oxide layer to a rapid thermal anneal process with a peak temperature of about 700° C. to about 1000° C. and a process time of about 10 seconds to about 10 minutes. However, other suitable anneal processes may be employed to convert the accommodating buffer layer to an amorphous layer in accordance with the present invention. For example, laser annealing or "conventional" thermal annealing processes (in the proper environment) may be used to form layer 36. When conventional thermal annealing is employed to form layer 36, an overpressure of one or more constituents of layer 30 may be required to prevent degradation of layer 30 during the anneal process.

Conductive layer 52—e.g, (La,Sr)CoO3, illustrated in FIGS. 3 and 4, may be epitaxially grown using sputter deposition. More particularly, the (La,Sr)CoO$_3$ layer may be grown using RF magnetron sputtering (face to face configuration) from a compressed (La,Sr)CoO$_3$ target. In accordance with one aspect of the invention, the deposition is performed with oxygen as sputter gas and a substrate temperature of about 400–600° C.

The process described above illustrates a process for forming a semiconductor structure including a silicon substrate, an overlying oxide layer, and a piezoelectric material layer by the processes of molecular beam epitaxy and RF sputtering. The process can also be carried out by the process of chemical vapor deposition (CVD), metal organic chemical vapor deposition (MOCVD), migration enhanced epitaxy (MEE), atomic layer epitaxy (ALE), physical vapor deposition (PVD), chemical solution deposition (CSD), pulsed laser deposition (PLD), or the like. Further, by a similar process, other monocrystalline accommodating buffer layers such as alkaline earth metal titanates, zirconates, hafnates, tantalates, vanadates, ruthenates, and niobates, alkaline earth metal tin-based perovskites, lanthanum aluminate, lanthanum scandium oxide, and gadolinium oxide can also be grown. Further, by a similar process such as MBE, other metallic oxide layers can be deposited overlying the monocrystalline oxide accommodating buffer layer. For example, the piezoelectric material may be grown via PLD by ablating a target of the desired material with an eximer laser and heating the substrate to a temperature of about 300° C. to about 500° C.

Each of the variations of piezoelectric material, conductive material, and monocrystalline oxide accommodating buffer layer may use an appropriate template for initiating the growth of the respective layer. In such a case, suitable template materials may be grown according to the methods described above in connection with growing layer 26.

Figure 6:
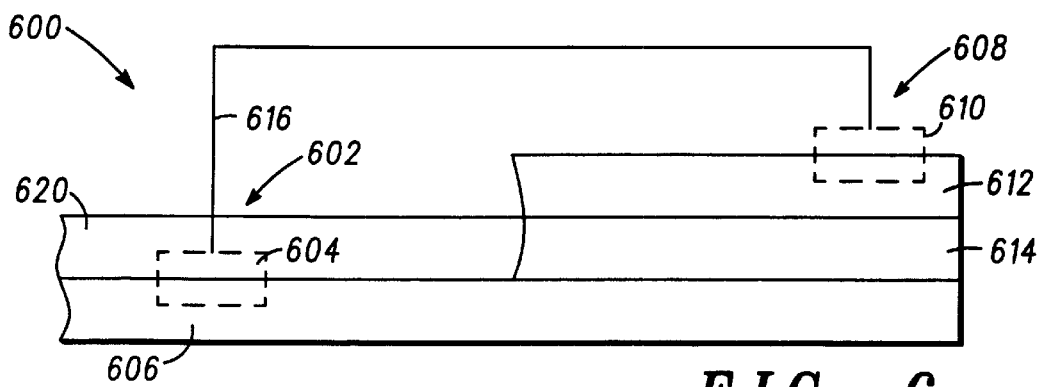
FIG. 6 illustrates schematically an integrated structure including an acoustic wave device.

FIG. 6. illustrates schematically, in cross section, a device structure 600 in accordance with a further embodiment of the invention. Structure 600 includes a first region 602 in which an electrical component 604 is formed within a substrate 606 and a second region 608 in which an acoustic wave device 610 is formed using a piezoelectric material layer 612. Forming acoustic wave device 610 and device 604 on a single substrate allows for monolithic integration of one or more of the devices. Such integration, however, is not required to practice the present invention: device 604 is optionally formed on or within substrate 606 in accordance with various embodiments of the invention.

Substrate 606 preferably includes a monocrystalline semiconductor material. For example and in accordance with an exemplary embodiment of the invention, substrate 606 includes a monocrystalline silicon substrate.

Electrical component 604 can be a resistor, a capacitor, an active semiconductor component such as a diode or a transistor or an integrated circuit such as a CMOS integrated circuit. For example, electrical semiconductor component 604 can be a CMOS integrated circuit configured to perform digital signal processing or another function for which silicon integrated circuits are well suited. The electrical semiconductor component in region 602 can be formed by conventional semiconductor processing as well known and widely practiced in the semiconductor industry. A layer of insulating material 620 such as a layer of silicon dioxide or the like may overlie electrical semiconductor component 604.

Insulating material 620 and any other layers that may have been formed or deposited during the processing of semiconductor component 604 in region 602 are removed from the surface of region 608 to provide a bare silicon surface in the region. As is well known, bare silicon surfaces are highly reactive and a native silicon oxide layer can quickly form on the bare surface. A layer of barium or barium and oxygen is deposited onto the native oxide layer on the surface of region 608 and is reacted with the oxidized surface to form a first template layer (not shown). In accordance with one embodiment of the invention a monocrystalline oxide layer is formed overlying the template layer by a process of molecular beam epitaxy. Reactants including barium, titanium and oxygen are deposited onto the template layer to form the monocrystalline oxide layer. Initially, during the deposition, the partial pressure of oxygen is kept near the minimum necessary to fully react with the barium and titanium to form the monocrystalline barium titanate layer. The partial pressure of oxygen is then increased to provide an overpressure of oxygen and to allow oxygen to diffuse through the growing monocrystalline oxide layer. The oxygen diffusing through the barium titanate reacts with silicon at the surface of region 608 to form an amorphous layer of silicon oxide on the second region and at the interface between the silicon substrate and the monocrystalline oxide.

In accordance with an embodiment of the invention, the step of depositing the monocrystalline oxide layer is terminated by depositing a second template layer, which can be 1–10 monolayers of titanium, barium, strontium, barium and oxygen, titanium and oxygen, or strontium and oxygen.

In accordance with one aspect of the present embodiment, after monocrystalline oxide layer formation, the monocrystalline titanate layer and the silicon oxide layer, which is interposed between substrate 606 and the titanate layer, are exposed to an anneal process such that the titanate and oxide layers form an amorphous oxide layer 614. However, such an anneal process is not required to practice the present invention: structure 600 may include a monocrystalline accommodating buffer layer.

Although not illustrated, during structure 600 formation, layer 612 material may be deposited over region 602. Because the material is deposited over amorphous material layer 620, the accommodating buffer layer material will form an amorphous layer in region 602. If desired, the accommodating buffer layer material may suitably be removed from region 602, or, alternatively, the material may remain in region 602 to provide additional device 604 insulation.

Acoustic wave device 610 may include either a surface acoustic wave (SAW) or bulk acoustic wave (BAW) device which is formed by growing, preferably epitaxially, a piezoelectric material over oxide 614. In accordance with the illustrated embodiment, piezoelectric material such as (Pb, Zr)TiO$_3$ is epitaxially grown over oxide layer 614. Acoustic wave device 610 may suitably be coupled to one or more electrical components (e.g., component 604) using any suitable interconnect, represented by line 616, to form a monolithic integrated system including an acoustic wave device.

Figure 7:
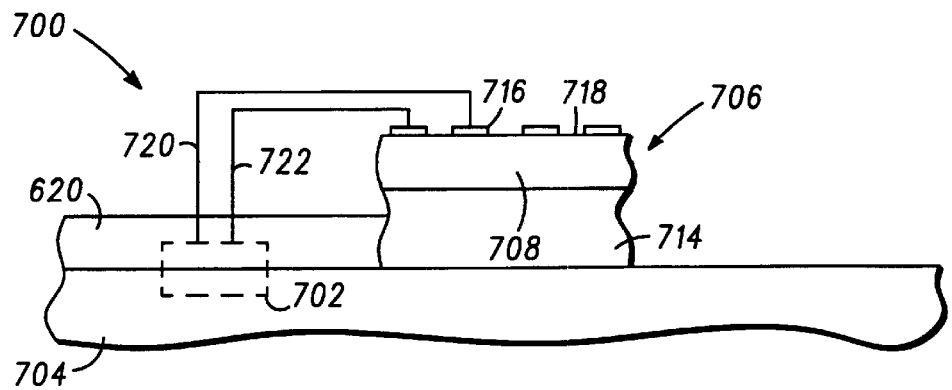
FIG. 7 illustrates schematically an integrated structure including a surface acoustic wave device.

FIG. 7 illustrates a structure 700 in accordance with an exemplary embodiment of the invention. As illustrated, structure 700 includes an electrical component 702 formed within a substrate 704 and a SAW device 706 device formed using a piezoelectric material layer 708. Although illustrated with electrical component or device 702, such a component is not necessary to practice the present invention.

Component 702 may include any device or a combination of devices described above in connection with device 604. In accordance with one exemplary embodiment, component 702 includes a driver circuit for SAW device 706. In this case, device 702 is coupled to a first portion of SAW device 706 via an interconnect illustrated by lines 720 and 722 to drive SAW device 706.

Substrate 704, piezoelectric layer 708, and accommodating layer 714 may include the same materials and may be formed according to the method described above in connection with substrate 606 and layers 612 and 614 described above in connection with FIG. 6. Once monocrystalline piezoelectric material is grown and etched to form layer 708, a transducer 716 is formed on a surface, e.g., a top surface 718, of layer 708.

Figure 8:
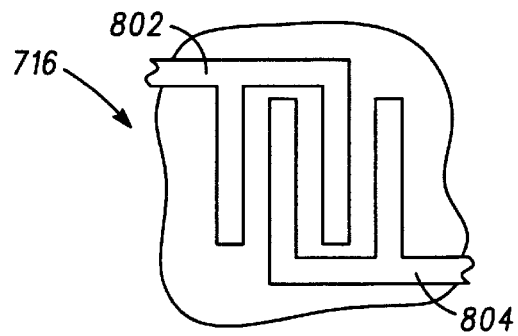
FIG. 8 illustrates schematically a top view of a transducer.

As illustrated in FIG. 8, transducer 716, in accordance with an exemplary embodiment of the invention, includes interdigitated finger electrodes 802 and 804 formed of conductive material. In this case, a resonance frequency of device 706 is determined by a spacing between adjacent electrode fingers. Other forms of transducers are considered to be within the scope of the invention.

Finger electrodes 802 and 804 may be formed by depositing conductive material such as metal (e.g., aluminum, an aluminum alloy, or platinum), patterning the material, and etching away material to form the electrodes. Alternatively, other processes may be employed to form transducer 716. For example, chemical mechanical polishing (CMP)/ damascene techniques with copper metal deposition may be used to form electrode 716.

Figure 9:
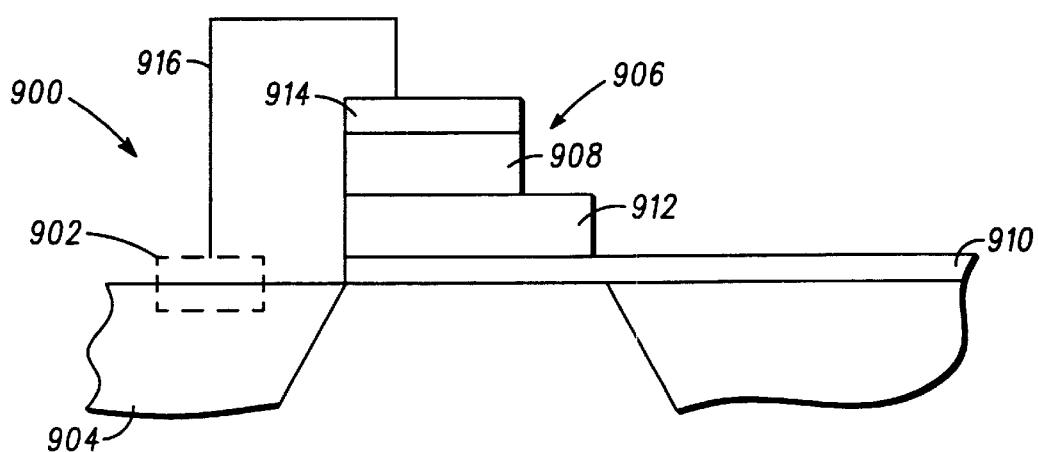
FIGS. 9–10 illustrate schematically an integrated structure including a bulk acoustic wave device.

FIG. 9 illustrates a structure 900 in accordance with another exemplary embodiment of the invention. Structure 900 includes an (optional) electrical component 902 formed within a substrate 904 and a BAW device 906 device formed using a piezoelectric material layer 908. An accommodating layer 910 and piezoelectric layer 908 are formed over substrate 904 using materials and according to the methods discussed above in connection with layers 612 and 614 and substrate 606. Similarly, component 902 may include any electronic device discussed in connection with device 604 and may be coupled to BAW 906, via an interconnect represented as line 916, to form a monolithically integrated BAW structure.

Structure 900 operates by applying an alternating bias across piezoelectric layer 908 sufficient to cause layer 908 to deform and cause an acoustic wave to transmit through layer 908. To effect a bias across piezoelectric material layer 908, a transducer including electrodes 912 and 914, is preferably formed about opposite sides of layer 908. In accordance with one embodiment of the invention, electrode 912 is formed of monocrystalline material such as conductive material discussed above in connection with layer 52 illustrated in FIGS. 3 and 4. Forming electrode 912 of monocrystalline material allows subsequent monocrystalline growth of piezoelectric material layer 908 over monocrystalline electrode 912. Electrode 914 may be formed of any conductive material such as the materials discussed above in connection with transducer 716 or electrode 912, and may be patterned using deposition and etch or CMP techniques.

A resonance frequency of device 906 can be manipulated by adjusting a thickness of layer 908. Accordingly, the thickness of layer 908 is often selected based on a desired resonating frequency of device 906. Further, because layer 908 is preferably epitaxially grown, the thickness and thus the resonating frequency of layer 908 can be tightly controlled.

To facilitate resonating of layer 908, a portion of substrate 904 is preferably removed proximate device 906. In accordance with one embodiment of the invention, the portion of substrate 904 is removed using an etch which selectively etches material of substrate 904 relative to material comprising layer 910. However, in accordance with an alternate embodiment of the invention, a portion of layer 910 and/or layer 912, beneath layer 908, may also be removed to further facilitate resonating of layer 908. In this case, additional etchants that selectively remove portions of layers 910 and/or 912 may be employed.

Figure 10:
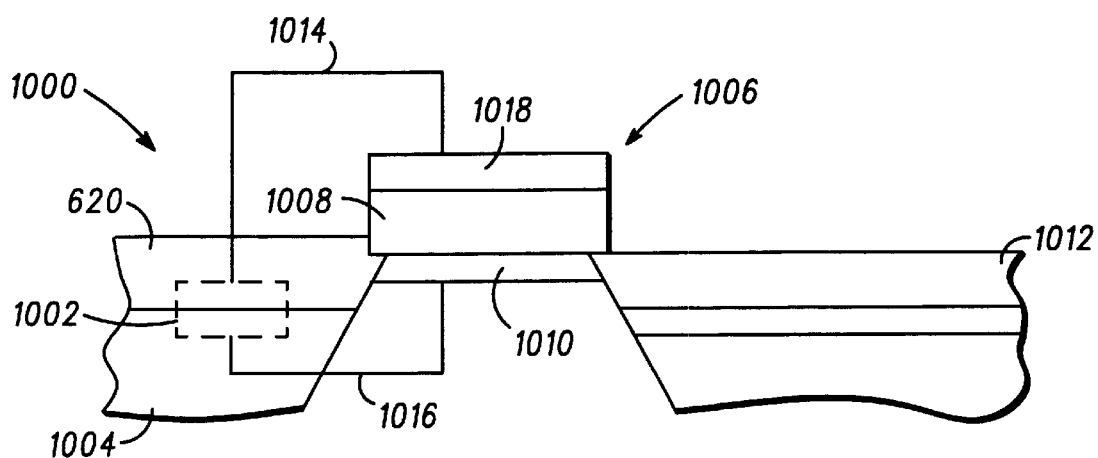

FIG. 10 illustrates a structure 1000 in accordance with yet another exemplary embodiment of the invention. Structure 1000 includes an electrical component 1002 formed within a substrate 1004 and a BAW device 1006 device formed using a piezoelectric material layer 1008. Similar to structures 700 and 900, device 1002 is not necessary to practice the present invention, but the inclusion of such devices may advantageously allow for integration of multiple components on a single substrate.

Structure 1000 is similar to structure 900, except that a lower electrode 1010 is formed on a lower surface of piezoelectric material layer 1008 by etching, from a back side using a suitable patterned mask and etchant(s), substrate 1004 material, an oxide layer 1012 material, and semiconductor material 1004. Electrode 1010 may then be formed by depositing conductive material onto the lower surface of piezoelectric material layer 1008. Once BAW device 1006 is formed in accordance with the present invention, device 1006 may be coupled to device 1002 using an interconnect schematically illustrated as lines 1014 and 1016, coupled respectively to a top electrode 1018 and lower electrode 1010.

Although illustrative structures 700, 900, and 1000 have been described as a structure formed on a silicon substrate and having a barium (or strontium) titanate layer, similar devices can be fabricated using other monocrystalline substrates and oxide layers as described elsewhere in this disclosure.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included in the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential features or elements of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

We claim:

1. An acoustic wave device comprising:
   a monocrystalline silicon substrate;
   an MOS circuit formed at least partially in the silicon substrate;
   a monocrystalline perovskite layer epitaxially formed overlying the silicon substrate;
   an amorphous interface layer formed underlying the monocrystalline perovskite layer;
   a layer of monocrystalline piezoelectric material having a surface epitaxially formed overlying the monocrystalline perovskite layer;
   a transducer formed on the surface of the layer of monocrystalline piezoelectric material; and
   an interconnection coupling the MOS circuit and the transducer.

2. The device of claim 1 wherein the monocrystalline perovskite layer comprises an insulator selected from the group consisting of alkaline earth metal titanates, zirconates, hafnates, tantalates, ruthenates, niobates and vanadates, tin based perovskites, lanthanum aluminate, lanthanum scandium oxide, and gadolinium oxide.

3. The device of claim 2 wherein the layer of monocrystalline piezoelectric material comprises a lead based perovskite.

4. The device of claim 3 wherein the layer of monocrystalline piezoelectric material comprises $(Pb,Zr)TiO_3$.

5. The device of claim 4 further comprising a monocrystalline buffer layer formed between the monocrystalline perovskite layer and the layer of monocrystalline piezoelectric material.

6. The device of claim 5 wherein the buffer layer comprises a monocrystalline conductive oxide layer.

7. The device of claim 6 wherein the monocrystalline conductive oxide layer comprises a material selected from the group consisting of $(La,Sr)CoO_3$ and $SrVO_3$.

8. The device of claim 2 wherein the amorphous interface layer comprises silicon oxide.

9. The device of claim 1 wherein the monocrystalline perovskite layer comprises $(Sr,Ba)TiO_3$.

10. The device of claim 1 wherein the transducer comprises an interdigitated transducer.

11. A bulk acoustic wave device comprising:
    a monocrystalline silicon substrate;
    an MOS circuit formed at least partially in the silicon substrate;

a monocrystalline perovskite layer epitaxially formed overlying the silicon substrate;

a monocrystalline conductive oxide layer epitaxially formed overlying the monocrystalline perovskite layer;

a layer of monocrystalline piezoelectric material epitaxially formed overlying the monocrystalline conductive oxide layer; and a conductive electrode formed overlying the layer of monocrystalline piezoelectric material.

12. The device of claim 11 wherein the layer of monocrystalline piezoelectric material has a predetermined thickness to determine a resonant frequency of the device.

13. The device of claim 12 wherein the thickness is in the range of about 100 nm to about 5000 nm.

14. The device of claim 12 wherein the layer of monocrystalline piezoelectric material comprises a lead based perovskite.

15. The device of claim 14 wherein the layer of monocrystalline piezoelectric material comprises $(Pb,Zr)TiO_3$.

16. The device of claim 12 further comprising a monocrystalline buffer layer formed between the monocrystalline perovskite layer and the layer of monocrystalline piezoelectric material.

17. The device of claim 16 wherein the buffer layer comprises a monocrystalline conductive oxide.

18. The device of claim 17 wherein the monocrystalline conductive oxide comprises a material selected from the group consisting of $(La,Sr)CoO_3$ and $SrVO_3$.

19. The device of claim 11 further comprising an amorphous interface layer formed underlying the monocrystalline perovskite layer.

20. The device of claim 11 wherein the monocrystalline perovskite layer comprises an insulator selected from the group consisting of alkaline earth metal titanates, zirconates, hafnates, tantalates, ruthenates, niobates and vanadates, tin based perovskites, lanthanum aluminate, lanthanum scandium oxide, and gadolinium oxide.

21. The device of claim 11 wherein the monocrystalline perovskite layer comprises $(Sr,Ba)TiO_3$.

22. The device of claim 11 wherein the monocrystalline conductive oxide comprises a material selected from the group consisting of $(La,Sr)CoO_3$ and $SrVO_3$.

23. The device of claim 11 further comprising interconnect metallization coupling the MOS circuit and the conductive electrode and coupling the MOS circuit and the monocrystalline conductive oxide layer.

24. A bulk acoustic wave device comprising:

a monocrystalline silicon substrate having a front surface and a rear surface;

a MOS circuit formed at least partially in the silicon substrate;

a monocrystalline perovskite layer epitaxially formed overlying the front surface of the silicon substrate;

a layer of monocrystalline piezoelectric material epitaxially formed overlying the monocrystalline perovskite layer, the layer of monocrystalline piezoelectric material having an upper surface and a lower surface, the lower surface facing the monocrystalline perovskite layer;

a concave recess etched in the rear surface of the silicon substrate and extending through the monocrystalline substrate;

a first conductive electrode contacting the lower surface of the monocrystalline piezoelectric material; and a second conductive electrode contacting the upper surface of the layer of monocrystalline piezoelectric material.

25. The device of claim 24 further comprising interconnect metallization coupling the first conductive electrode and the second conductive electrode to the MOS circuit.

26. An acoustic wave device comprising:

a monocrystalline silicon substrate;

a MOS circuit formed at least partially in the silicon substrate;

a first monocrystalline layer comprising $(Sr,Ba)TiO_3$ epitaxially formed overlying the silicon substrate;

an amorphous silicon oxide interface layer formed underlying the first monocrystalline layer;

a second monocrystalline layer comprising $(Pb,Zr)TiO_3$ having a surface epitaxially formed overlying the first monocrystalline layer;

an interdigitated transducer formed on the surface; and interconnect metallization coupling the MOS circuit and the interdigitated transducer.

* * * * *